US008724415B2

(12) United States Patent
Kuroda

(10) Patent No.: US 8,724,415 B2
(45) Date of Patent: May 13, 2014

(54) STORAGE CONTROL DEVICE CONTROLLING REFRESH FREQUENCY BASED ON TEMPERATURE

(75) Inventor: Masami Kuroda, Tokyo (JP)

(73) Assignee: Sony Corporation, Tokyo (JP)

( * ) Notice: Subject to any disclaimer, the term of this patent is extended or adjusted under 35 U.S.C. 154(b) by 426 days.

(21) Appl. No.: 12/929,272

(22) Filed: Jan. 12, 2011

(65) Prior Publication Data

US 2011/0205826 A1   Aug. 25, 2011

(30) Foreign Application Priority Data

Feb. 22, 2010   (JP) ................. 2010-036311

(51) Int. Cl.
  *G11C 7/00*   (2006.01)
  *G11C 11/406*   (2006.01)
  *G11C 7/04*   (2006.01)

(52) U.S. Cl.
  CPC ........ *G11C 11/406* (2013.01); *G11C 11/40626* (2013.01); *G11C 11/40618* (2013.01); *G11C 7/04* (2013.01)
  USPC .......................................... 365/222; 365/211

(58) Field of Classification Search
  USPC ................................. 365/222, 211
  See application file for complete search history.

(56) References Cited

U.S. PATENT DOCUMENTS

| 4,768,170 | A  | * | 8/1988 | Hoff | 365/212 |
|---|---|---|---|---|---|
| 6,879,536 | B2 | * | 4/2005 | Lee | 365/222 |
| 7,075,847 | B2 | * | 7/2006 | Kim et al. | 365/222 |
| 7,233,538 | B1 | * | 6/2007 | Wu et al. | 365/222 |
| 7,403,440 | B2 | * | 7/2008 | Perner | 365/222 |
| 7,450,456 | B2 | * | 11/2008 | Jain et al. | 365/212 |
| 7,489,579 | B2 | * | 2/2009 | Ho | 365/222 |
| 7,543,106 | B2 | * | 6/2009 | Choi | 711/106 |
| 7,554,872 | B2 | * | 6/2009 | Ayukawa et al. | 365/230.03 |
| 7,590,473 | B2 | * | 9/2009 | Wyatt | 700/299 |
| 7,760,569 | B2 | * | 7/2010 | Ruf et al. | 365/211 |
| 7,813,205 | B2 | * | 10/2010 | Sako | 365/222 |
| 7,940,591 | B2 | * | 5/2011 | Mitchell, Jr. | 365/211 |
| 8,174,921 | B2 | * | 5/2012 | Kim et al. | 365/222 |
| 2007/0247944 | A1 | * | 10/2007 | Fischer et al. | 365/212 |
| 2008/0169860 | A1 | * | 7/2008 | Song | 327/513 |

FOREIGN PATENT DOCUMENTS

| JP | 2005-158222 |   | 6/2005 |
|---|---|---|---|
| JP | 2005-235362 | * | 9/2005 |
| JP | 2005-253562 |   | 9/2005 |

\* cited by examiner

*Primary Examiner* — Kretelia Graham
(74) *Attorney, Agent, or Firm* — Rader, Fishman & Grauer PLLC

(57) ABSTRACT

Disclosed herein is a storage control device that includes a temperature sensor, temperature information selection section, refresh command reception section and trigger issuance frequency setting section.

10 Claims, 11 Drawing Sheets

F I G. 6

| TEMPERATURE CONDITION | Dtemp (TEMPERATURE INFORMATION) | REFRESH RATE |
|---|---|---|
| LOW TEMPERATURE | L | 0.5-FOLD |
| HIGH TEMPERATURE | H | 1-FOLD |

FIG. 7A

| TRNMODE (CONTROL MODE) | | Dtemp-0 | Dtemp-3 | Dtemp-1 |
|---|---|---|---|---|
| H (COMMON CONTROL MODE) | | L (LOW TEMPERATURE) | L (LOW TEMPERATURE) | L (LOW TEMPERATURE) |
| | | H (HIGH TEMPERATURE) | L (LOW TEMPERATURE) | H (HIGH TEMPERATURE) |
| | | L (LOW TEMPERATURE) | H (HIGH TEMPERATURE) | H (HIGH TEMPERATURE) |
| | | H (HIGH TEMPERATURE) | H (HIGH TEMPERATURE) | H (HIGH TEMPERATURE) |
| L (INDIVIDUAL CONTROL MODE) | | L (LOW TEMPERATURE) | IGNORE | L (LOW TEMPERATURE) |
| | | H (HIGH TEMPERATURE) | IGNORE | H (HIGH TEMPERATURE) |

FIG. 7B

| TRNMODE (CONTROL MODE) | Dtemp-0 | Dtemp-2 | RFTG-2 |
|---|---|---|---|
| H (COMMON CONTROL MODE) | L (LOW TEMPERATURE) | L (LOW TEMPERATURE) | ISSUE FOR EACH REFRESH COMMAND RECEIVED |
| | L (LOW TEMPERATURE) | H (HIGH TEMPERATURE) | ISSUE ONCE FOR EACH TWO REFRESH COMMAND RECEIVED |
| | H (HIGH TEMPERATURE) | H (HIGH TEMPERATURE) | ISSUE FOR EACH REFRESH COMMAND RECEIVED |
| L (INDIVIDUAL CONTROL MODE) | L (LOW TEMPERATURE) | IGNORE | ISSUE FOR EACH REFRESH COMMAND RECEIVED |
| | H (HIGH TEMPERATURE) | IGNORE | ISSUE FOR EACH REFRESH COMMAND RECEIVED |

FIG. 8

| TRNMODE (CONTROL MODE) | | Dtemp-0 | Dtemp-3 | Dtemp-1 |
|---|---|---|---|---|
| H (COMMON CONTROL MODE) | TEMPERATURE CONDITION #1 | TEMPERATURE CONDITION #1 | TEMPERATURE CONDITION #1 |
| | | | TEMPERATURE CONDITION #2 | TEMPERATURE CONDITION #2 |
| | | | TEMPERATURE CONDITION #3 | TEMPERATURE CONDITION #3 |
| | | | ⋮ | ⋮ |
| | | | TEMPERATURE CONDITION #k | TEMPERATURE CONDITION #k |
| | TEMPERATURE CONDITION #2 | | TEMPERATURE CONDITION #1 | TEMPERATURE CONDITION #2 |
| | | | TEMPERATURE CONDITION #2 | TEMPERATURE CONDITION #2 |
| | | | TEMPERATURE CONDITION #3 | TEMPERATURE CONDITION #3 |
| | | | ⋮ | ⋮ |
| | | | TEMPERATURE CONDITION #k | TEMPERATURE CONDITION #k |
| | TEMPERATURE CONDITION #3 | | TEMPERATURE CONDITION #1 | TEMPERATURE CONDITION #3 |
| | | | TEMPERATURE CONDITION #2 | TEMPERATURE CONDITION #3 |
| | | | TEMPERATURE CONDITION #3 | TEMPERATURE CONDITION #3 |
| | | | TEMPERATURE CONDITION #4 | TEMPERATURE CONDITION #4 |
| | | | ⋮ | ⋮ |
| | | | TEMPERATURE CONDITION #k | TEMPERATURE CONDITION #k |
| | ⋮ | ⋮ | ⋮ | ⋮ |
| | TEMPERATURE CONDITION #k | | TEMPERATURE CONDITION #1 | TEMPERATURE CONDITION #k |
| | | | TEMPERATURE CONDITION #2 | TEMPERATURE CONDITION #k |
| | | | TEMPERATURE CONDITION #3 | TEMPERATURE CONDITION #k |
| | | | TEMPERATURE CONDITION #4 | TEMPERATURE CONDITION #k |
| | | | ⋮ | ⋮ |
| | | | TEMPERATURE CONDITION #k | TEMPERATURE CONDITION #k |
| L (INDIVIDUAL CONTROL MODE) | | TEMPERATURE CONDITION #1 | IGNORE | TEMPERATURE CONDITION #1 |
| | | TEMPERATURE CONDITION #2 | IGNORE | TEMPERATURE CONDITION #2 |
| | | ⋮ | ⋮ | ⋮ |
| | | TEMPERATURE CONDITION #n | IGNORE | TEMPERATURE CONDITION #n |

FIG. 9

| TRNMODE (CONTROL MODE) | Dtemp-0 (#p) | Dtemp-2 (#q) | RFTG-2 |
|---|---|---|---|
| H (COMMON CONTROL MODE) | TEMPERATURE CONDITION #1 | TEMPERATURE CONDITION #1 | ISSUE ONCE FOR EACH $2^{(1-1)}$ REFRESH COMMAND RECEIVED |
| | | TEMPERATURE CONDITION #2 | ISSUE ONCE FOR EACH $2^{(2-1)}$ REFRESH COMMAND RECEIVED |
| | | TEMPERATURE CONDITION #3 | ISSUE ONCE FOR EACH $2^{(3-1)}$ REFRESH COMMAND RECEIVED |
| | | TEMPERATURE CONDITION #4 | ISSUE ONCE FOR EACH $2^{(4-1)}$ REFRESH COMMAND RECEIVED |
| | | ⋮ | ⋮ |
| | | TEMPERATURE CONDITION #k | ISSUE ONCE FOR EACH $2^{(k-1)}$ REFRESH COMMAND RECEIVED |
| | TEMPERATURE CONDITION #2 | TEMPERATURE CONDITION #1 | ISSUE $2^{(2-1)}$ TIMES FOR EACH REFRESH COMMAND RECEIVED |
| | | TEMPERATURE CONDITION #2 | ISSUE ONCE FOR EACH $2^{(2-2)}$ REFRESH COMMAND RECEIVED |
| | | TEMPERATURE CONDITION #3 | ISSUE ONCE FOR EACH $2^{(3-2)}$ REFRESH COMMAND RECEIVED |
| | | TEMPERATURE CONDITION #4 | ISSUE ONCE FOR EACH $2^{(4-2)}$ REFRESH COMMAND RECEIVED |
| | | ⋮ | ⋮ |
| | | TEMPERATURE CONDITION #k | ISSUE ONCE FOR EACH $2^{(k-2)}$ REFRESH COMMAND RECEIVED |
| | TEMPERATURE CONDITION #3 | TEMPERATURE CONDITION #1 | ISSUE $2^{(3-1)}$ TIMES FOR EACH REFRESH COMMAND RECEIVED |
| | | TEMPERATURE CONDITION #2 | ISSUE $2^{(3-2)}$ TIMES FOR EACH REFRESH COMMAND RECEIVED |
| | | TEMPERATURE CONDITION #3 | ISSUE ONCE FOR EACH $2^{(3-3)}$ REFRESH COMMAND RECEIVED |
| | | TEMPERATURE CONDITION #4 | ISSUE ONCE FOR EACH $2^{(4-3)}$ REFRESH COMMAND RECEIVED |
| | | ⋮ | ⋮ |
| | | TEMPERATURE CONDITION #k | ISSUE ONCE FOR EACH $2^{(k-3)}$ REFRESH COMMAND RECEIVED |
| | ⋮ | ⋮ | ⋮ |
| | TEMPERATURE CONDITION #k | TEMPERATURE CONDITION #1 | ISSUE $2^{(k-1)}$ TIMES FOR EACH REFRESH COMMAND RECEIVED |
| | | TEMPERATURE CONDITION #2 | ISSUE $2^{(k-2)}$ TIMES FOR EACH REFRESH COMMAND RECEIVED |
| | | TEMPERATURE CONDITION #3 | ISSUE $2^{(k-3)}$ TIMES FOR EACH REFRESH COMMAND RECEIVED |
| | | TEMPERATURE CONDITION #4 | ISSUE $2^{(k-4)}$ TIMES FOR EACH REFRESH COMMAND RECEIVED |
| | | ⋮ | ⋮ |
| | | TEMPERATURE CONDITION #k | ISSUE $2^{(k-k)}$ TIMES FOR EACH REFRESH COMMAND RECEIVED |
| L (INDIVIDUAL CONTROL MODE) | TEMPERATURE CONDITION #1 | IGNORE | ISSUE FOR EACH REFRESH COMMAND RECEIVED |
| | TEMPERATURE CONDITION #2 | IGNORE | ISSUE FOR EACH REFRESH COMMAND RECEIVED |
| | ⋮ | ⋮ | ⋮ |
| | TEMPERATURE CONDITION #k | IGNORE | ISSUE FOR EACH REFRESH COMMAND RECEIVED |

STORAGE CONTROL DEVICE CONTROLLING REFRESH FREQUENCY BASED ON TEMPERATURE

BACKGROUND OF THE INVENTION

1. Field of the Invention

The present invention relates to a storage control device, storage device and storage device system and, more particularly, to a storage control device, storage device and storage device system that control refresh according to the temperature conditions of dynamic memories.

2. Description of the Related Art

A dynamic memory stores information by the presence or absence of an electric charge held by capacitors. This type of memory requires a refresh that is composed of reading out the data stored in the memory and rewriting the data before the charge is lost due to a leak current. On the other hand, a leak current in a dynamic memory is known to have a temperature dependence which causes the leak current to diminish at low temperatures and increase at high temperatures.

Therefore, when the refresh frequency is set according to the leak current flow at high temperatures, this frequency is excessively high if left unchanged, thus resulting in wasted power consumption. For this reason, a technique has been proposed that is designed to change the refresh frequency based on temperature information obtained by detecting the memory temperature (refer, for example, to Japanese Patent Laid-Open No. 2005-158222 (FIG. 1) and Japanese Patent Laid-Open No. 2005-235362 (FIG. 2)).

SUMMARY OF THE INVENTION

In the above existing techniques, temperature information obtained by temperature detection has to be output to change the refresh frequency according to the memory temperature. In this case, a possible configuration would be, for example, to output temperature information from each of a plurality of memory chips to a logic block or other integrated control section so that the logic block can change the refresh frequency for each memory chip based on the received temperature information. However, this configuration requires an increased number of wires for supplying temperature information from each of the memory chips to the logic block.

The present invention has been made in light of the foregoing, and it is an aim of the present invention to provide a simpler wiring structure adapted to output temperature information from each memory in order to control a refresh in a manner appropriate to the temperature conditions of the plurality of memories.

The present invention has been made to solve the above problem. A first mode of the present invention is a storage control device that includes a temperature sensor, temperature information selection section, refresh command reception section and trigger issuance frequency setting section. The temperature sensor detects the temperature condition to generate own temperature information. The temperature information selection section selects, based on the temperature condition indicated by selected temperature information supplied from a storage control device at the previous stage and the temperature condition indicated by the own temperature information, either the supplied selected temperature information or own temperature information. The temperature information selection section outputs the selected external output temperature information or own temperature information to a storage control device at the next stage as selected temperature information. The refresh command reception section receives a refresh command whose transmission frequency is set according to the temperature condition indicated by integrated temperature information, i.e., selected temperature information obtained by a storage control device at the final stage. The trigger issuance frequency setting section sets, in response to the reception of the refresh command, a refresh trigger issuance frequency based on the integrated temperature information supplied from the storage control device at the final stage and the own temperature information. The refresh trigger causes a memory array to perform a refresh. This provides an advantageous effect in that, in order for a storage control device to output temperature information, a signal path is formed that is adapted to output selected temperature information to the storage control device at the next stage.

Further, in the first mode, the trigger issuance frequency setting section may set, as a refresh trigger issuance frequency, the number of issuances of the refresh trigger for a given unit number of receptions of the refresh command. This provides an advantageous effect in that a refresh trigger issuance frequency suitable for each of the storage control devices is set in response to the change in refresh command transmission frequency.

Still further, in the first mode, the trigger issuance frequency setting section may change the issuance frequency of a temporary refresh trigger, issued at the frequency appropriate to the reception of the refresh command, to the frequency appropriate to the number of issuances, and output the temporary refresh trigger as the refresh trigger. This provides an advantageous effect in that a refresh trigger issuance frequency suitable for each of the storage control devices is set in the configuration adapted to issue the refresh trigger in synchronism with the refresh command.

Still further, in the first mode, the storage control device of interest may further include a signal switching section. The signal switching section forms a signal path adapted to supply the integrated temperature information from the storage control device at the final stage to the trigger issuance frequency setting section if the storage control device of interest is not the one at the final stage. The signal switching section forms two signal paths, one adapted to supply the selected temperature information from the temperature information selection section to the trigger issuance frequency setting section as the integrated temperature information, and another adapted to output the selected temperature information to other external storage control device as the integrated temperature information, if the storage control device is the one at the final stage. This provides an advantageous effect in that the signal switching section establishes one of the two signal paths of the integrated temperature information, one for the storage control device at a stage other than the final stage, and another for the storage control device at the final stage.

Still further, in the first mode, the temperature information selection section may select the own temperature information and output this information as the selected temperature information irrespective of the temperature condition indicated by the supplied selected temperature information if the storage control device of interest is the one at the first stage. This provides an advantageous effect in that a storage control device functions as the one at the first stage.

Still further, in the first mode, an electrode adapted to output the selected temperature information to the storage control device at the next stage may be provided on the bottom surface of the storage control device of interest and located at the same position as an electrode adapted to receive the selected temperature information. This electrode is provided on the top surface of the storage control device at the next stage that is located adjacent to and below the storage control device of interest when the storage control device of interest and other storage control devices are stacked one on top of the others. This provides an advantageous effect in that, when storage control devices are stacked one on top of the others, the selected temperature information is output through junction between the electrodes, one on the storage control device of interest and another on the storage control device located therebelow that corresponds to the storage control device at the next stage.

Still further, in the first mode, an electrode adapted to receive the selected temperature information from the storage control device at the previous stage may be provided on the top surface of the storage control device of interest and located at the same position as an electrode adapted to output the selected temperature information. This electrode is provided on the bottom surface of the storage control device at the previous stage that is located above and adjacent to the storage control device of interest when the storage control device of interest and other storage control devices are stacked one on top of the others. This provides an advantageous effect in that, when storage control devices are stacked one on top of the others, the selected temperature information is received through junction between the electrodes, one on the storage control device of interest and another on the storage control device located thereabove that corresponds to the storage control device at the previous stage.

Still further, in the first mode, an electrode adapted to receive or output the integrated temperature information may include a penetrating electrode and be located at the same position as penetrating electrodes provided on other storage control devices as part of a signal path of the integrated temperature information when the storage control device of interest and the other storage control devices are stacked one on top of the others. This provides an advantageous effect in that, when storage control devices are stacked one on top of the others, the signal path of the integrated temperature information is shared between the upper and lower storage control devices through junction between the electrodes.

Further, a second mode of the present invention is a storage device that includes a memory array, temperature sensor, temperature information selection section, refresh command reception section and trigger issuance frequency setting section. The temperature sensor detects the temperature condition to generate own temperature information. The temperature information selection section selects, based on the temperature condition indicated by selected temperature information supplied from a storage device at the previous stage and the temperature condition indicated by the own temperature information, either the supplied selected temperature information or own temperature information. The temperature information selection section outputs the selected external output temperature information or own temperature information to a storage device at the next stage as selected temperature information. The refresh command reception section receives a refresh command whose transmission frequency is set according to the temperature condition indicated by integrated temperature information, i.e., selected temperature information obtained by a storage device at the final stage. The trigger issuance frequency setting section sets, in response to the reception of the refresh command, a refresh trigger issuance frequency based on the integrated temperature information supplied from the storage device at the final stage and the own temperature information. The refresh trigger causes the memory array to perform a refresh. This provides an advantageous effect in that, in order for a storage device to output temperature information, a signal path is formed that is adapted to output selected temperature information to the storage device at the next stage.

Further, a third mode of the present invention is a storage device system that includes a plurality of storage devices stacked one on top of the others. Each of the storage devices includes a memory array, temperature sensor, temperature information selection section, refresh command reception section, trigger issuance frequency setting section, selected temperature information output electrode, selected temperature information input electrode and integrated temperature information electrode. The temperature sensor detects the temperature condition to generate own temperature information. The temperature information selection section outputs the own temperature information in the absence of a previous stage storage device at the previous stage of and adjacent to the storage device of interest. In the presence of the previous stage storage device, the temperature information selection section selects, based on the temperature condition indicated by selected temperature information supplied from the previous stage storage device and the temperature condition indicated by the own temperature information, either the supplied selected temperature information or own temperature information. The temperature information selection section outputs the selected external output temperature information or own temperature information to a lower storage device located below and adjacent to the storage device of interest or refresh control device as selected temperature information. The refresh command reception section receives a refresh command whose transmission frequency is set according to the temperature condition indicated by integrated temperature information, i.e., selected temperature information obtained by a lowermost storage control device. The trigger issuance frequency setting section sets, in response to the reception of the refresh command, a refresh trigger issuance frequency based on the integrated temperature information supplied from the storage control device at the final stage and the own temperature information. The refresh trigger causes the memory array to perform a refresh. The selected temperature information output electrode is provided on the bottom surface of the storage device of interest to output the selected temperature information to the lower storage device. This electrode is located at the same position as an electrode provided on the top surface of the lower storage device and adapted to receive the selected temperature information. The selected temperature information input electrode is provided on the top surface of the storage device of interest to receive the selected temperature information from the storage device at the previous stage. This electrode is located at the same position as an electrode provided on the bottom surface of the upper storage device and adapted to output the selected temperature information. The integrated temperature information electrode includes a penetrating electrode adapted to receive or output the integrated temperature information. This electrode is located at the same position as penetrating electrodes provided on other storage devices as part of a signal path of the integrated temperature information. This provides an advantageous effect in that two signal paths, one adapted to receive or output the selected temperature information between the upper and lower storage devices, and another of the integrated temperature information, are formed through junction between the electrodes on the chip surfaces of the two storage devices. This provides another advantageous effect in that the signal path of the integrated temperature information is shared between the storage devices.

Further, a fourth mode of the present invention is a storage device system that includes a plurality of storage devices and a refresh control device all in a chip form, stacked one on top of the others. Each of the storage devices includes a memory array, temperature sensor, temperature information selection section, refresh command reception section, trigger issuance frequency setting section, selected temperature information output electrode, selected temperature information input electrode and integrated temperature information electrode. The temperature sensor detects the temperature condition to generate own temperature information. The temperature information selection section outputs the own temperature information in the absence of a previous stage storage device at the previous stage of and adjacent to the storage device of interest. In the presence of the previous stage storage device, the temperature information selection section selects, based on the temperature condition indicated by selected temperature information supplied from the previous stage storage device and the temperature condition indicated by the own temperature information, either the supplied selected temperature information or own temperature information. The temperature information selection section outputs the selected external output temperature information or own temperature information to a lower storage device located below and adjacent to the storage device of interest or refresh control device as selected temperature information. The refresh command reception section receives a refresh command. The trigger issuance frequency setting section receives integrated temperature information, i.e., selected temperature information obtained by a lowermost storage control device and sets, in response to the reception of the refresh command, a refresh trigger issuance frequency based on the received integrated temperature information and own temperature information. The refresh trigger causes the memory array to perform a refresh. The selected temperature information output electrode is provided on the bottom surface of the storage device of interest to output the selected temperature information to the lower storage device. This electrode is located at the same position as an electrode provided on the top surface of the lower storage device and adapted to receive the selected temperature information. The selected temperature information input electrode is provided on the top surface of the storage device of interest to receive the selected temperature information from the storage device at the previous stage. This electrode is located at the same position as an electrode provided on the bottom surface of the upper storage device and adapted to output the selected temperature information. The integrated temperature information electrode includes a penetrating electrode adapted to receive or output the integrated temperature information. This electrode is located at the same position as penetrating electrodes provided on other storage devices as part of a signal path of the integrated temperature information. The refresh control device includes a command transmission section and integrated temperature information input electrode. The command transmission section transmits the refresh command to each of the storage devices through broadcasting according to the transmission frequency set based on integrated temperature information received from the lowermost storage control device. The integrated temperature information input electrode is provided on the top surface of the refresh control device to receive the integrated temperature information and located at the same position as the selected temperature information output electrode of the lowermost storage device that is located above and adjacent to the refresh control device. This provides an advantageous effect in that two signal paths, one adapted to receive or output the selected temperature information between the upper and lower storage devices or between a storage device and logic block, and another of the integrated temperature information, are formed. This provides another advantageous effect in that the signal path of the integrated temperature information is shared between the storage device and logic block.

The present invention is advantageous in providing a simpler wiring structure adapted to output temperature information from each memory in order to control refresh in a manner appropriate to the temperature conditions of the plurality of memories.

BRIEF DESCRIPTION OF THE DRAWINGS

FIG. 6 is a truth table illustrating an example of establishing correspondence between temperature information level and refresh rate according to the first embodiment of the present invention when the temperature condition is binary, i.e., high or low temperature;

FIGS. 7A and 7B are truth tables, one for a temperature information selection section and another for a trigger issuance frequency setting section shown in FIG. 4;

FIG. 8 is a truth table for the temperature information selection section when the temperature condition is a k-level value where k is equal to or greater than 3;

FIG. 9 is a truth table for the trigger issuance frequency setting section when the temperature condition is a k-level value where k is equal to or greater than 3;

DETAILED DESCRIPTION OF THE PREFERRED EMBODIMENTS

A description will be given below of the modes for carrying out the present invention (hereinafter referred to as embodiments) with reference to the accompanying drawings. It should be noted that the description will be given in the following order:

1. First Embodiment (configuration in which each memory of the memory system is capable of receiving and outputting selected temperature information and integrated temperature information for refresh appropriate to temperature)

2. Second Embodiment (example in which configuration in which each memory of the memory system is capable of receiving and outputting selected temperature information and integrated temperature information for refresh appropriate to temperature is applied to a stacked memory system)

1. First Embodiment

Figure 1:
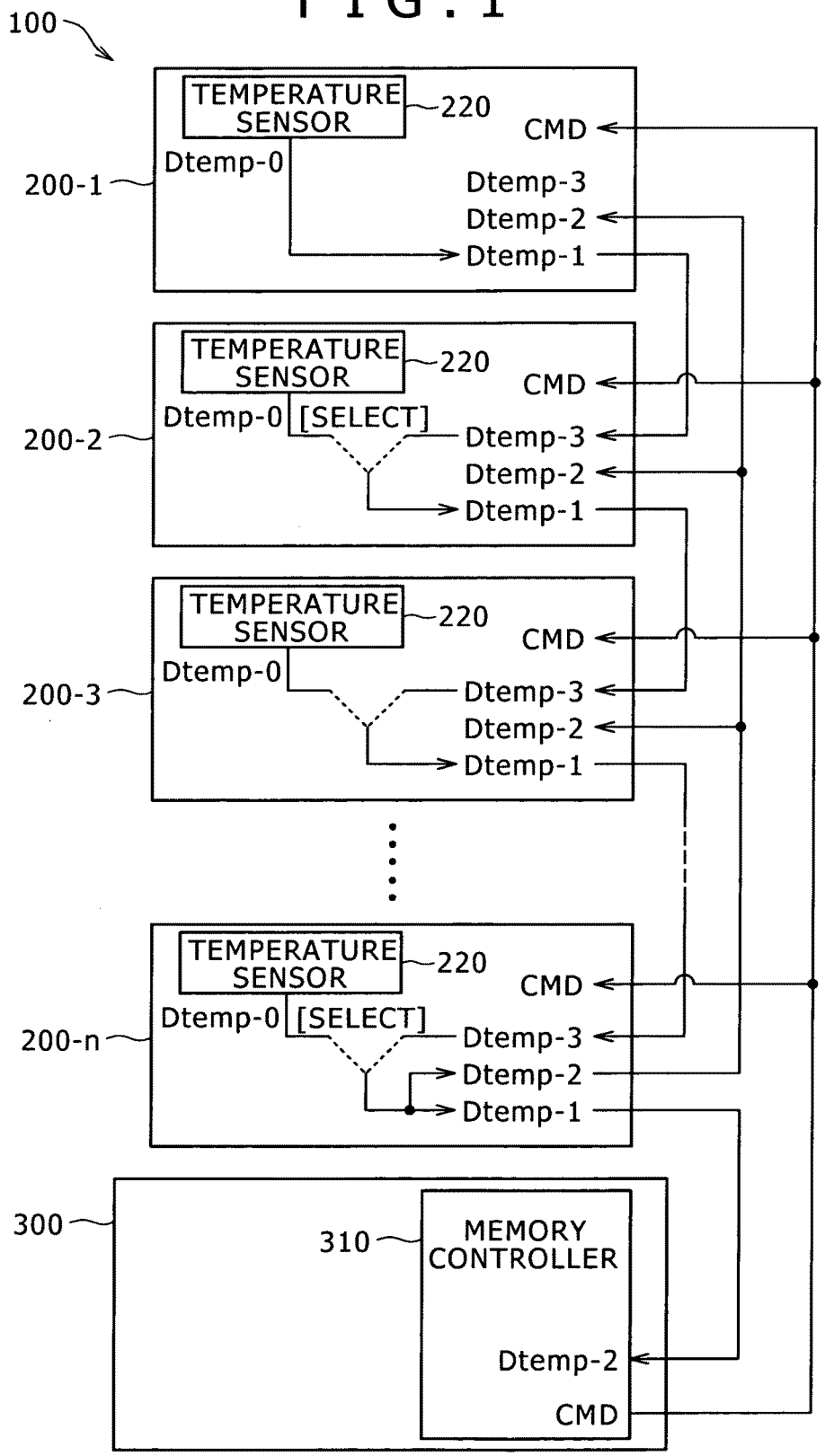
FIG. 1 is a block diagram illustrating an overall configuration example of a memory system according to a first embodiment of the present invention.

Configuration for Receiving and Outputting Temperature Information between Memories of the Memory System FIG. 1 illustrates an example of reception and output of temperature information in a memory system 100 according to an embodiment of the present invention that includes a plurality of memories.

The memory system 100 includes n memories, i.e., first to nth memories 200-1 to 200-$n$, and a logic block 300. In the present embodiment, each of the first to nth memories 200-1 to 200-$n$ is physically formed, for example, as a discrete memory chip. Further, the logic block 300 is also formed as a chip. These chips are arranged at predetermined positions, for example, on a substrate. It should be noted that, in the description given below, the first to nth memories 200-1 to 200-$n$ may be written as memories 200 if all or some thereof are treated collectively with no particular distinction.

The memories 200 include, for example, a dynamic memory array and are designed to hold data as described later. It should be noted that the capacities of the first to nth memories 200-1 to 200-$n$ need not necessarily be the same. However, we assume that the first to nth memories 200-1 to 200-$n$ have the same interface.

The logic block 300 according to the present embodiment is designed to perform various types of required control and processes. Of these types of control, that exercised over the memories 200 of the memory system 100 is performed by a memory controller 310 of the logic block 300. The memory controller 310 outputs various necessary commands CMD according to the control or process to be performed. It should be noted that the logic block 300 is an example of the refresh controller described in the appended claims. Further, the memory controller 310 is an example of the command transmission section described in the appended claims.

Because the memories 200 according to the present embodiment are dynamic memories, these memories have to be refreshed regularly. The logic block 300 according to the present embodiment causes the memories 200 to perform a refresh as a means of controlling these memories. In order to do so, the memory controller 310 of the logic block 300 transmits, as one of the commands CMD, a refresh command, instructing that a refresh be performed. The memories 200 perform a refresh in response to the reception of the refresh command.

Moreover, the logic block 300 (memory controller 310) according to the present embodiment changes the frequency at which the refresh command is transmitted according to the temperature of the memories 200. That is, it is possible to change the frequency at which the memories 200 perform a refresh. Therefore, the memory controller 310 receives integrated temperature information Dtemp-2 that is treated as integrated information of the temperature condition indicated by own temperature information Dtemp-0 detected by each of the memories 200. Then, the memory controller 310 changes the frequency at which the refresh command is transmitted according to the temperature information indicated by the integrated temperature information Dtemp-2.

Further, each of the memories 200 includes a temperature sensor 220. The temperature sensor 220 detects the temperature condition of the associated memory and generates temperature information indicating the detected temperature condition. The temperature information obtained from the temperature sensor 220 is treated as the own temperature information Dtemp-0.

A signal path of the commands CMD can be connected to each of the memories 200. Further, three signal paths, one for output selection temperature information Dtemp-1, another for the integrated temperature information Dtemp-2 and still another for input selection temperature information Dtemp-3, can be connected to each of the memories 200. In response, each of the memories 200 physically includes four terminals, one for each of the commands CMD, output selection temperature information Dtemp-1, integrated temperature information Dtemp-2 and input selection temperature information Dtemp-3. It should be noted that the signal paths need not be physically linear. For example, the signal paths may be, for example, formed as a contact between the electrodes. In any case, a path adapted to transfer the associated signal between the memories 200 and logic block is referred here to as a signal path.

In this memory system 100, the signal path of the commands CMD is formed as follows. That is, the memories 200 and logic block 300 are connected together by a common signal path. This allows for the command CMD output from the memory controller 310 of the logic block 300 to be simultaneously supplied to all the memories 200. Therefore, the refresh command output from the logic block 300 is simultaneously supplied to all the memories 200.

A description will be given next of the wiring for temperature information. In this description, the memories 200 can be considered to be connected in series to form multiple stages in terms of the wiring of the signal paths for the output selection temperature information Dtemp-1 and input selection temperature information Dtemp-3. Here, the first memory 200-1 is treated as the first stage, and the second memory 200-2, third memory 200-3 and so on are treated as the second stage, third stage and so on, with the nth memory treated as the final (nth) stage.

First, the first memory 200-1 at the first stage does not receive the input selection temperature information Dtemp-3. Therefore, no signal path is connected to the terminal for the input selection temperature information Dtemp-3. The terminal of the first memory 200-1 for the output selection temperature information Dtemp-1 is connected to the terminal of the memory 200-2 at the next stage or second stage for the input selection temperature information Dtemp-3 via a signal path. Next, the terminal of the memory 200-2 at the second stage for the output selection temperature information Dtemp-1 is connected to the terminal of the memory 200-3 at the next stage or third stage for the input selection temperature information Dtemp-3 via a signal path. The terminals of the succeeding memories up to the nth memory 200-$n$ at the final stage are connected in the same manner. That is, the terminal of an ith memory 200-$i$ at the ith stage for the output selection temperature information Dtemp-1 is connected to the terminal of an i+1th memory 200-$(i+1)$ at the next stage or (i+1)th stage for the input selection temperature information Dtemp-3 via a signal path.

As described above, the memories 200 and logic block 300 can be considered to be connected in series to form multiple stages in terms of the wiring of the signal paths for the output selection temperature information Dtemp-1 and input selection temperature information Dtemp-3.

Next, as for the integrated temperature information Dtemp-2, the terminals of the memories 200 for the integrated temperature information Dtemp-2 are connected together via a common signal path. This allows for the integrated temperature information Dtemp-2 output from the nth memory 200-$n$ at the final stage to be simultaneously supplied to all the memories 200 at the stages previous thereto as described later. On the other hand, the terminal of the memory controller 310 of the logic block 300 for the integrated temperature information Dtemp-2 is connected to the terminal of the nth memory 200-n at the final stage for the output selection temperature information Dtemp-1.

[Example of Generation of Integrated Temperature Information]

A description will be given next of an example of generation of the integrated temperature information Dtemp-2. Consequently, the integrated temperature information Dtemp-2 indicates the highest temperature condition of all the pieces of the own temperature information Dtemp-0 obtained from the first to nth memories 200-1 to 200-n.

First, the first memory 200-1 at the first stage always outputs the own temperature information Dtemp-0 output from the temperature sensor 220 of its own as the output selection temperature information Dtemp-1. That is, the output selection temperature information Dtemp-1 of the first memory 200-1 at the first stage always indicates the same temperature condition as that of the own temperature information Dtemp-0.

The second memory 200-2 at the second stage receives the output selection temperature information Dtemp-1 from the first memory 200-1 at the previous stage as the input selection temperature information Dtemp-3. Next, the second memory 200-2 compares the own temperature information Dtemp-0 output from the temperature sensor 220 of its own and the input selection temperature information Dtemp-3 and selects the temperature information indicating the higher temperature condition of the two. Then, the second memory 200-2 outputs the selected temperature information as the output selection temperature information Dtemp-1. This output selection temperature information Dtemp-1 is supplied to the memory 200-3 at the next stage via a signal path as the input selection temperature information Dtemp-3.

As with the second memory 200-2 at the previous stage, the third memory 200-3 also compares the own temperature information Dtemp-0 output from the temperature sensor 220 of its own and the input selection temperature information Dtemp-3 and selects the temperature information indicating the higher temperature condition of the two. Then, the third memory 200-3 outputs the selected temperature information as the output selection temperature information Dtemp-1. This output selection temperature information Dtemp-1 is supplied to the memory at the next stage as the input selection temperature information Dtemp-3. Similarly, the following memories up to the nth memory 200-n at the final stage select the temperature information indicating the higher temperature condition of the two pieces of information, i.e., the own temperature information Dtemp-0 and input selection temperature information Dtemp-3 and output the selected temperature information as the output selection temperature information Dtemp-1.

Thus, the two pieces of information, i.e., the output selection temperature information Dtemp-1 and input selection temperature information Dtemp-3, are exchanged between the memories 200. As a result, the temperature information selected by the nth memory 200-n at the final stage indicates the highest temperature condition of all the own temperature information Dtemp-0 obtained from the memories 200. Further, the temperature condition obtained as described above can be considered to indicate the integrated temperature condition of the pieces of the own temperature information Dtemp-0 of the memories 200.

The nth memory 200-n outputs the selected temperature information as the output selection temperature information Dtemp-1 as described earlier. This output information is supplied to the memory controller 310 of the logic block 300 as the integrated temperature information Dtemp-2. The nth memory 200-n also outputs the selected temperature information from the terminal for the integrated temperature information Dtemp-2. This allows for the integrated temperature information Dtemp-2 to be supplied to all the memories 200 other than that at the final stage. Although described later, each of the first to nth memories 200-1 to 200-n can set the refresh frequency deemed appropriate according to its own temperature condition based on the integrated temperature information Dtemp-2 and own temperature information Dtemp-0.

The memory system 100 according to the present embodiment transmits a refresh command from the logic block 300 (memory controller 310) to the memories 200 through broadcasting at the frequency consistent with the integrated temperature information Dtemp-2 as described later. In addition, each of the memories 200 can individually set an appropriate refresh frequency according to the temperature condition indicated by the own temperature information Dtemp-0 of its own. Then, by adopting the wiring of the signal paths for temperature information shown in FIG. 1 and the configuration adapted to generate the integrated temperature information Dtemp-2, the present embodiment provides a simpler wiring for temperature information.

For example, in order to set the refresh frequency individually for each memory of the existing memory systems, it has been necessary to supply each piece of own temperature information, obtained from the temperature sensor of each of the memories, to the logic block. This requires as many wires adapted to supply temperature information from the memories to the logic block as the number of memories. As a result, the logic block has to have as many temperature information input terminals as the number of memories. Further, the logic block sets an appropriate refresh frequency for each memory according to the supplied temperature information. Therefore, the logic block has to transmit a different refresh command to each memory through unicasting. This leads to refresh command interrupt service routines, one for each of the memories, to be handled by the logic block, resulting in lower processing speed, lower bus utilization efficiency and other disadvantages.

In contrast, the signal path of the output selection temperature information Dtemp-1 need only be connected to the memory 200 at the next stage or logic block 300 (for the nth memory 200-n at the final stage) in the present embodiment as illustrated in FIG. 1. That is, there is no need to connect the signal paths of all the memories 200 for the output selection temperature information Dtemp-1 to the logic block 300 as with the existing memory systems. As a result, the logic block 300 requires only one terminal to receive the integrated temperature information Dtemp-2. Further, the terminals of the memories 200 for the integrated temperature information Dtemp-2 are connected together by a common signal path. That is, the present embodiment provides a simpler wiring for temperature information.

In the present embodiment, on the other hand, the logic block 300 transmits a refresh command through broadcasting. Broadcasting eliminates the refresh command service routine for each of the memories 200 because the refresh frequency controlled by the logic block 300 is the same for all the memories 200, so that the refresh command interrupt service routines, one for each of the memories can be avoided. Therefore, there is no decline in processing speed or bus utilization efficiency. In the present embodiment, however, each of the memories 200 can individually change or set the refresh frequency despite the fact that the memories 200 receive a refresh command through broadcasting.

[Overall Configuration Example of the Memories]

Figure 2:
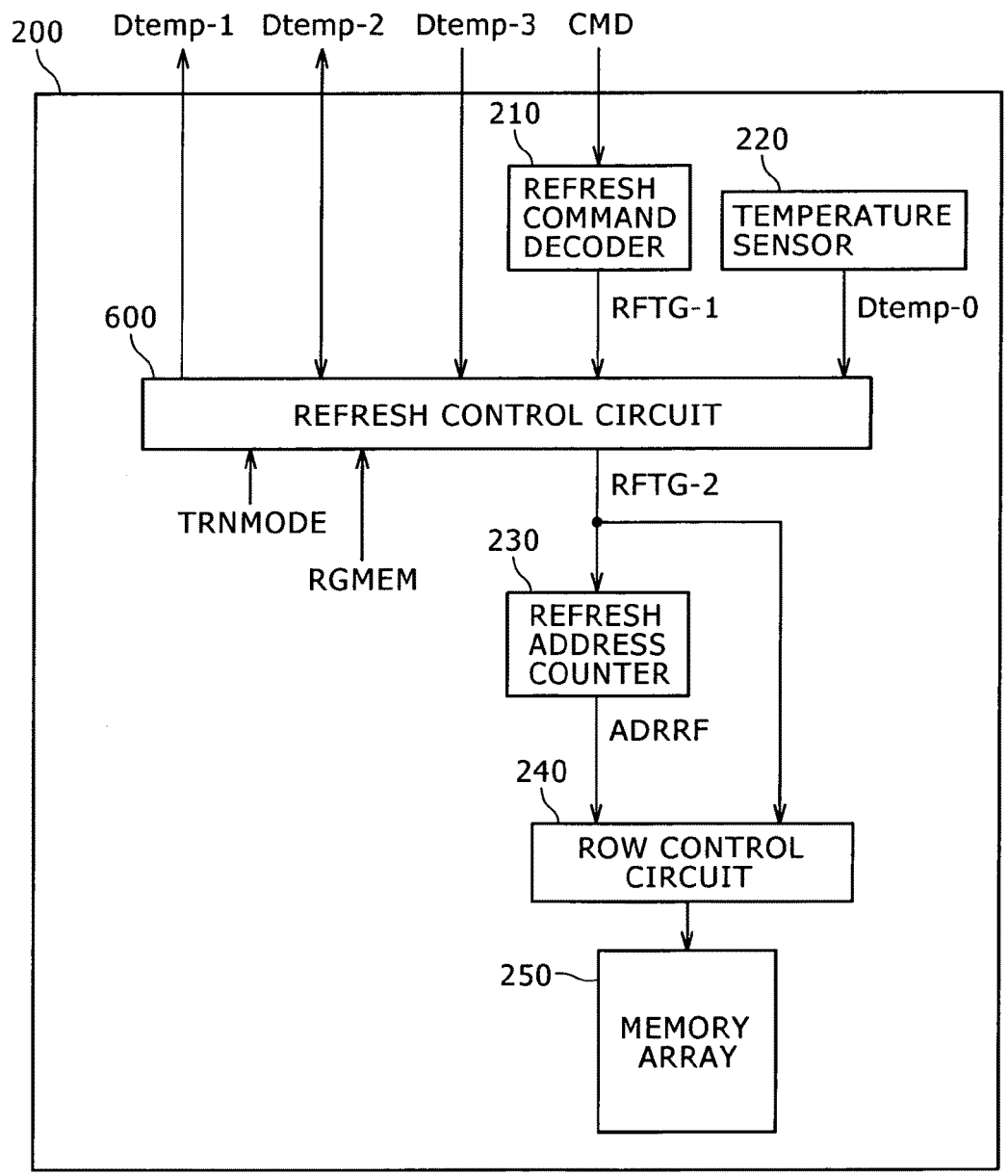
FIG. 2 is a block diagram illustrating a configuration example of a memory according to the first embodiment of the present invention.

FIG. 2 illustrates a configuration example of the memory 200 related to refresh according to the present embodiment. As illustrated in FIG. 2, the memory 200 includes a refresh command decoder 210, the temperature sensor 220, a refresh control circuit 600, refresh address counter 230, row control circuit 240 and memory array 250.

The refresh command decoder 210 discriminates and extracts a refresh command instructing the execution of refresh as decoding of the command CMD. More specifically, the refresh command decoder 210 receives and inputs the command CMD from the logic block 300 (memory controller 310). Next, the same decoder 210 identifies whether the received command CMD is a refresh command, for example, by referring to the command ID of the received command CMD. Then, when the refresh command decoder 210 identifies the received command CMD as a refresh command, the same decoder 210 issues and outputs an indirect refresh trigger RFTG-1. The indirect refresh trigger RFTG-1 is a signal originally designed to trigger the memory array 250, which will be described later, to perform a refresh. The same trigger RFTG-1 serves, for example, as a pulse generated in response to the reception of a refresh command. In the case of the present embodiment, however, the indirect refresh trigger RFTG-1 does not serve as a direct trigger. Instead, direct refresh trigger RFTG-2 serves as a direct trigger. The direct refresh trigger RFTG-2 is output from the refresh control circuit 600 based on the indirect refresh trigger RFTG-1. It should be noted that the portion of the memory 200 made up of the terminal adapted to receive the commands CMD and the refresh command decoder 210 is an example of the refresh command reception section described in the appended claims. Further, the indirect refresh trigger RFTG-1 and direct refresh trigger RFTG-2 are, respectively, examples of the temporary refresh trigger and refresh trigger described in the appended claims.

The temperature sensor 220 detects the temperature of the associated memory and outputs the own temperature information Dtemp-0 indicating the detected temperature condition as described with reference to FIG. 1. It should be noted that the temperature sensor 220 is preferably arranged near the memory array 250 in the same memory 200. However, the temperature sensor 220 may be arranged somewhat far from the memory array 250 due to physical restrictions in the chip of the memory 200.

The refresh control circuit 600 generates and outputs (issues) the direct refresh trigger RFTG-2 using the indirect refresh trigger RFTG-1 received from the refresh command decoder 210. The direct refresh trigger RFTG-2 is obtained, for example, as a pulse whose output intervals are set so that a refresh is performed at the frequency appropriate to the temperature condition of the associated memory 200. On the other hand, the refresh control circuit 600 generates and outputs the output selection temperature information Dtemp-1 as described with reference to FIG. 1.

The refresh control circuit 600 receives the own temperature information Dtemp-0 from the temperature sensor 220. Further, the same circuit 600 also receives the input selection temperature information Dtemp-3. Further, the same circuit 600 outputs the output selection temperature information Dtemp-1. Still further, the same circuit 600 can switch between input and output modes. That is, the same circuit 600 receives the integrated temperature information Dtemp-2 if the associated memory 200 is the one at a stage other than the final stage. The same circuit 600 outputs the integrated temperature information Dtemp-2 if the associated memory 200 is the one at the final stage.

Still further, the refresh control circuit 600 receives a mode switching signal TRNMODE and register information RGMEM. The significances of the mode switching signal TRNMODE and register information RGMEM and the operation of the refresh control circuit 600 in response thereto will be described later.

The refresh address counter 230 is a counter adapted to count and output a refresh address ADRRF. The refresh address ADRRF is counted for each pulse of the input direct refresh trigger RFTG-2 obtained.

The row control circuit 240 refreshes the memory array 250 on a row-by-row basis. Therefore, the same circuit 240 receives the refresh address ADRRF and direct refresh trigger RFTG-2. The row control circuit 240 selects the row of the memory array 250 indicated by the refresh address ADRRF and passes a refresh current through the memory cells in the selected row at the timing appropriate to a pulse of the direct refresh trigger RFTG-2. This allows for a refresh to be performed on a row-by-row basis as the refresh address ADRRF is updated.

The memory array 250 is a group of storage elements with dynamic memory cells arranged in an array form. The memory cells of the memory array 250 are assigned row addresses that are, for example, arranged vertically in ascending order. The memory cells are also assigned column addresses that are, for example, arranged horizontally in ascending order. As can be understood from the description given so far, the memory cells making up the memory array 250 are refreshed.

[Configuration Example of the Refresh Control Circuit]

Figure 3:
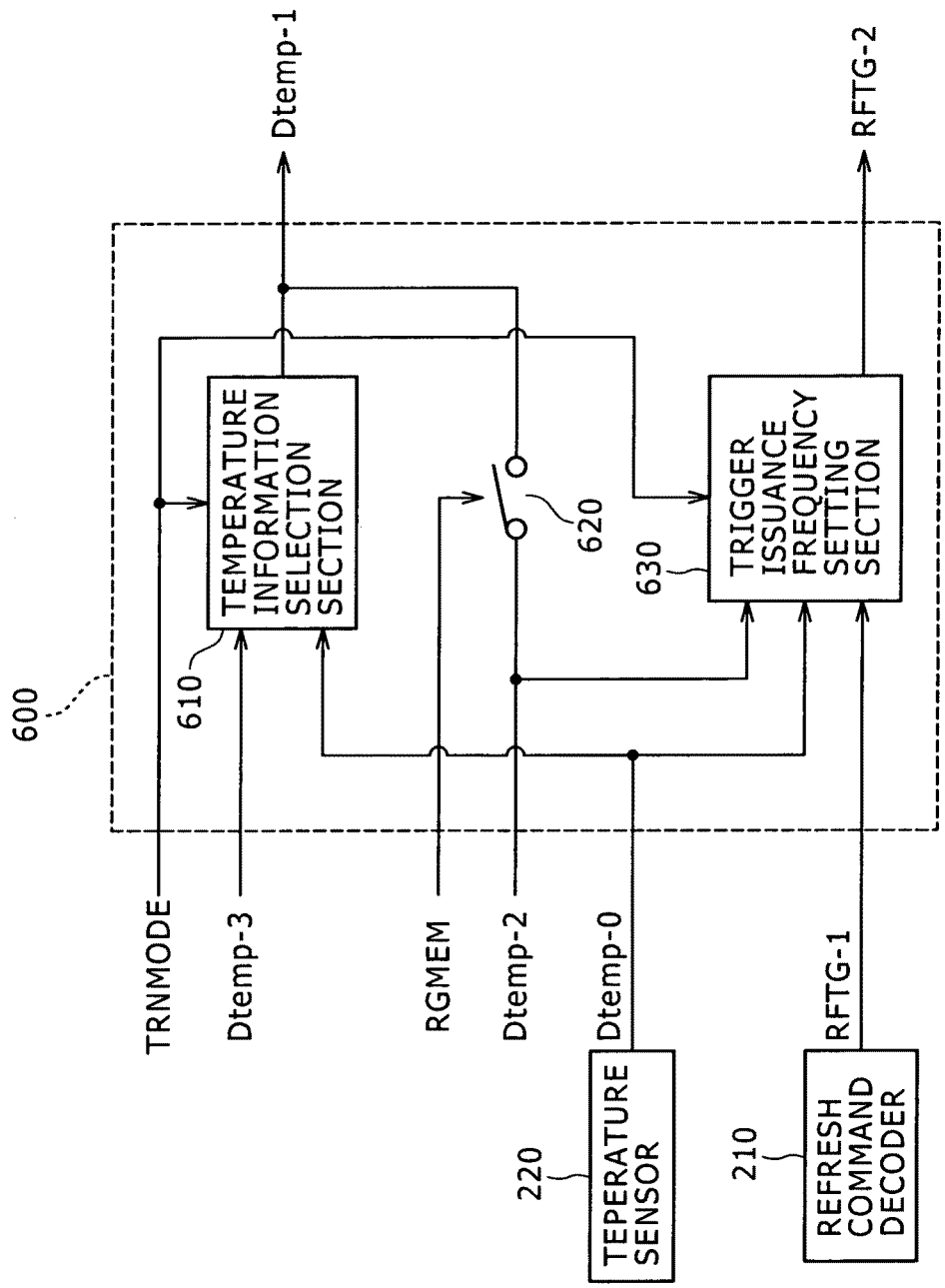
FIG. 3 is a block diagram illustrating a functional configuration example of a refresh control circuit according to the first embodiment of the present invention.

The block diagram shown in FIG. 3 illustrates a configuration example of the refresh control circuit 600. As illustrated in FIG. 3, the refresh control circuit 600 can be considered to include a temperature information selection section 610, switching section 620 and trigger issuance frequency setting section 630.

Here, a description will be given first of the mode switching signal TRNMODE. In the memory system 100 according to the present embodiment, the logic block 300 controls all the memories 200 in common through broadcasting as described earlier. In this mode, on the other hand, each of the memories 200 can set an appropriate refresh frequency by itself according to its own temperature condition. Another mode is also available with the memory system 100 in which the logic block 300 can individually control the refresh of each of the memories 200, for example, according to the existing configuration described earlier. Here, the former mode for the present embodiment is referred to as the common control mode, and the latter mode consistent with the existing configuration is referred to as the individual control mode.

The mode switching signal TRNMODE indicates in which of the two modes, namely, the common control mode and individual control mode, the memory system 100 is. For example, the mode switching signal TRNMODE is high to indicate the common control mode and low to indicate the individual control mode. The temperature information selection section 610 and trigger issuance frequency setting section 630 switch between operation modes associated with the common control mode and individual control mode in response to the mode switching signal TRNMODE.

It should be noted that, in the description of FIG. 3, the mode switching signal TRNMODE is always high. We assume, therefore, that the temperature information selection section 610 and trigger issuance frequency setting section 630 operate in the mode associated with the common control mode.

On the other hand, the register information RGMEM indicates at which stage of the multi-stage connection configuration of the memory system 100 the associated memory 200 is. The register information RGMEM is stored, for example, in a register (not shown) included in the memory 200. The same information RGMEM is supplied as a signal adapted to control the on/off status of the switching section 620. We assume, for example, that the switching section 620 is controlled, for example, to be off when the register information RGMEM indicates that the associated memory is the one at a stage other than the final stage, and to be on when the register information RGMEM indicates that the associated memory is the one at the final stage.

A description will be given first of the operation of the temperature information selection section 610. The same section 610 receives the input selection temperature information Dtemp-3 and the own temperature information Dtemp-0 supplied from the temperature sensor 220. Next, the temperature information selection section 610 compares the temperature conditions indicated by the input selection temperature information Dtemp-3 and own temperature information Dtemp-0 that have been received. The same section 610 selects the temperature information containing the temperature condition indicating the higher temperature and outputs this information as the output selection temperature information Dtemp-1. It should be noted that if the temperatures indicated, respectively, by the input selection temperature information Dtemp-3 and own temperature information Dtemp-0 as the temperature conditions are the same, the temperature information selection section 610 may select and output either of the two pieces of the temperature information.

On the other hand, if the associated memory is the first memory 200-1 at the first stage, the input selection temperature information Dtemp-3 is not supplied to the temperature information selection section 610. In response, the same section 610 outputs the own temperature information Dtemp-0, supplied from the temperature sensor 220, as the output selection temperature information Dtemp-1 as it is.

In the refresh control circuit 600, on the other hand, the signal path of the output selection temperature information Dtemp-1 branches out and is connected to one end of the switching section 620. The switching section 620 has its other end connected to the signal path of the integrated temperature information Dtemp-2. The switching section 620 is on only when the associated memory 200 is the one at the final stage as described earlier. When the switching section 620 is on, the signal path of the output selection temperature information Dtemp-1 is connected to that of the integrated temperature information Dtemp-2 via the switching section 620. This provides a capability of outputting the output selection temperature information Dtemp-1 externally as the integrated temperature information Dtemp-2 as illustrated in FIG. 1 as the nth memory 200-n. This also provides a capability of supplying the output selection temperature information Dtemp-1 to the trigger issuance frequency setting section 630 as the integrated temperature information Dtemp-2.

In contrast, when the associated memory 200 is the one at a stage other than the final stage, the switching section 620 is off. As a result, the refresh control circuit 600 operates in such a manner as to receive the integrated temperature information Dtemp-2 from external equipment as also illustrated as the memories at the stages other than the final stage in FIG. 1. It should be noted that the switching section 620 is an example of the signal switching section described in the appended claims.

Next, the trigger issuance frequency setting section 630 changes and sets the issuance frequency of the direct refresh trigger RFTG-2. The integrated temperature information Dtemp-2, own temperature information Dtemp-0 and indirect refresh trigger RFTG-1 are supplied to the trigger issuance frequency setting section 630. First, the trigger issuance frequency setting section 630 determines the thinning rate of the pulses of the indirect refresh trigger RFTG-1 based on the relationship in temperature condition between the integrated temperature information Dtemp-2 and own temperature information Dtemp-0. Then, the same section 630 thins out the number of the pulses of the indirect refresh trigger RFTG-1 according to the determined thinning rate and outputs the pulses, whose number has been thinned out, as the direct refresh trigger RFTG-2. The intervals at which the pulses of the direct refresh trigger RFTG-2 are output are commensurate with the refresh frequency suitable for the own temperature condition at present. The pulse issuance frequency of the direct refresh trigger RFTG-2 is changed as described above. It should be noted that the thinning process conducted here also includes a case in which the pulses are practically not thinned out because the thinning rate is determined to be 0%. On the other hand, the pulses of the direct refresh trigger RFTG-2 formed by the thinning process described above may be issued at a frequency different from that at which a refresh command is received. However, the pulses of the direct refresh trigger RFTG-2 are synchronous with the refresh command reception timing, as with the pulses of the indirect refresh trigger RFTG-1.

[Specific Configuration Example of the Refresh Control Circuit]

Figure 4A:
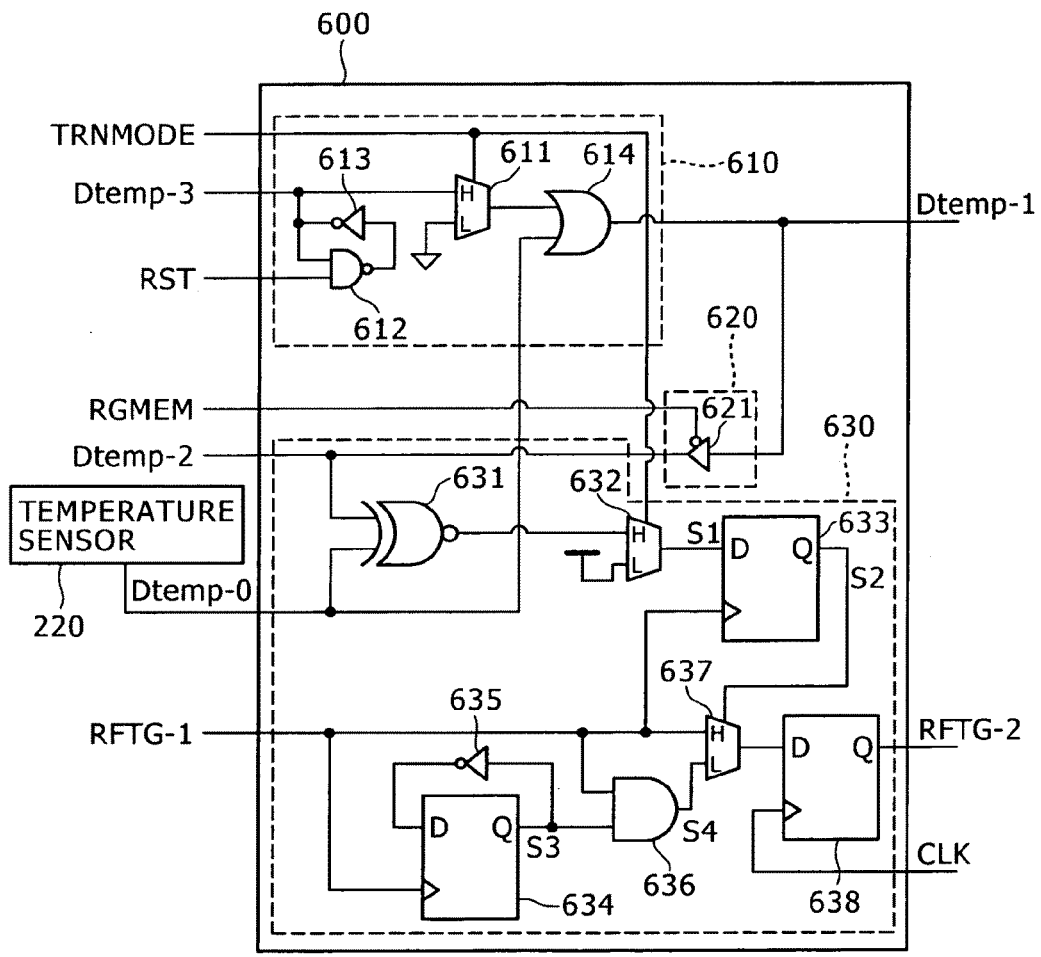
FIGS. 4A and 4B are logic circuit diagrams illustrating a specific configuration example of the refresh control circuit according to the first embodiment of the present invention.

Next, the logic circuit diagram shown in FIG. 4A illustrates a specific configuration example of the refresh control circuit 600 shown in FIG. 3. As for FIG. 4A, we assume that the temperature information and refresh rate are defined as illustrated in FIG. 6. That is, the temperature information Dtemp represents the temperature condition with a binary value of high or low temperature. In this case, "L" represents low temperature, and "H" represents high temperature. It should be noted that these definitions apply in common to the own temperature information Dtemp-0, output selection temperature information Dtemp-1, integrated temperature information Dtemp-2 and input selection temperature information Dtemp-3.

As for the refresh rates consistent with the definitions of the temperature conditions, the temperature Dtemp of "L" or low temperature is associated with 0.5 fold, whereas the temperature Dtemp of "H" or high temperature is associated with one fold.

In FIG. 4A, the temperature information selection section 610 includes a selector 611, NAND gate 612, inverter 613 and OR gate 614. The switching section 620 includes a clocked buffer 621. On the other hand, the trigger issuance frequency setting section 630 includes an exclusive NOR gate 631, selector 632, flip-flops 633 and 634, inverter 635, AND gate 636, selector 637 and flip-flop 638.

In the temperature information selection section 610, the selector 611 selects one of the two signals, i.e., the input selection temperature information Dtemp-3 and fixed signal fixed at low level, according to the mode switching signal TRNMODE. More specifically, when the mode switching signal TRNMODE is high, the selector 611 selects the input selection temperature information Dtemp-3. When the mode switching signal TRNMODE is low, the selector 611 selects the fixed signal. In the description given here, the mode switching signal TRNMODE is high because the common control mode is selected. Therefore, the selector 611 always selects the input selection temperature information Dtemp-3.

The OR gate 614 outputs the logical sum of the input selection temperature information Dtemp-3 which is the output of the selector 611 and the own temperature information Dtemp-0 supplied from the temperature sensor 220 as the output selection temperature information Dtemp-1. The OR gate 614 outputs a high level signal when at least one of the inputs is high. Therefore, the OR gate 614 can be considered to select the temperature information containing the temperature condition indicating the higher temperature of the two pieces of information, i.e., the input selection temperature information Dtemp-3 and own temperature information Dtemp-0, and outputs the selected information as the output selection temperature information Dtemp-1. Further, the OR gate 614 outputs a high level signal when both the input selection temperature information Dtemp-3 and own temperature information Dtemp-0 are high. The same gate 614 outputs a low level signal when both the input selection temperature information Dtemp-3 and own temperature information Dtemp-0 are low. That is, when the same temperature condition is indicated by the two pieces of information, the OR gate 614 outputs the output selection temperature information Dtemp-1 indicating that temperature condition.

A fixed signal circuit that includes the NAND gate 612 and inverter 613 is connected to the signal path of the input selection temperature information Dtemp-3. This fixed signal circuit maintains the input associated with the input selection temperature information Dtemp-3 of the selector 611 at high level if the input selection temperature information Dtemp-3 is not supplied to the associated memory 200 because the same memory 200 is the one at the first stage.

A reset signal RST and the input selection temperature information Dtemp-3 are supplied to the NAND gate 612. The inverter 613 inverts the output of the NAND gate 612 and outputs it to one of the inputs of the NAND gate 612 that receives the input selection temperature information Dtemp-3.

The reset signal RST serves, for example, as a trigger for a variety of initializations. In this case, the same signal RST is pulled low, for example, at the time of power-on and then maintained high from that point onward. In the fixed signal circuit, as the reset signal RST is pulled low, the output of the inverter 613 is fixed at low level. It should be noted that if the input selection temperature information Dtemp-3 is inverted from high to low level or vice versa, the output of the inverter 613 is also inverted from high to low level or vice versa in response thereto.

In contrast, if the input selection temperature information Dtemp-3 is not externally supplied, the output of the inverter 613 remains fixed at low level. As a result, the signal path of the input selection temperature information Dtemp-3 is regularly fixed at the potential associated with low level in the first memory 200-1 at the first stage. In response, the OR gate 614 always outputs the own temperature information Dtemp-0 as the output selection temperature information Dtemp-1 for consistency with the first memory 200-1 at the first stage.

On the other hand, the clocked buffer 621 of the switching section 620 turns on or off the connection between the signal paths of the output selection temperature information Dtemp-1 and integrated temperature information Dtemp-2. In this case, the signal path of the output selection temperature information Dtemp-1 is connected to the input of the clocked buffer 621, and the signal path of the integrated temperature information Dtemp-2 is connected to the output of the same buffer 621.

Serving as a clock supplied to the clocked buffer 621, the register information RGMEM indicates at which stage of the multi-stage connection configuration of the memory system 100 the associated memory 200 is. We assume that if the associated memory 200 is the one at the final stage, "0" is, for example, assigned to this memory as its ID number, and that the register information RGMEM is low. We also assume that if the associated memory 200 is the one at a stage other than the final stage, the register information RGMEM is high.

As a result, when the register information RGMEM is low, this low level is inverted, and a high level clock is supplied to the clocked buffer 621. This allows for the output selection temperature information Dtemp-1 to be output as the integrated temperature information Dtemp-2 as it is. That is, an input/output path of temperature information for the nth memory 200-$n$ at the final stage is formed. In contrast, when the register information RGMEM is high, the connection is interrupted between the signal paths of the output selection temperature information Dtemp-1 and integrated temperature information Dtemp-2. As a result, an input/output path of temperature information for the memory 200 at a stage other than the final stage is formed.

Next, the exclusive NOR gate 631 of the trigger issuance frequency setting section 630 is capable of detecting whether the temperature conditions of the integrated temperature information Dtemp-2 and own temperature information Dtemp-0 match. More specifically, the exclusive NOR gate 631 outputs a low level signal if there is no match, that is, if the integrated temperature information Dtemp-2 and own temperature information Dtemp-0 are high and low or low and high, respectively. On the other hand, the exclusive NOR gate 631 outputs a high level signal when there is a match, that is, when both the integrated temperature information Dtemp-2 and own temperature information Dtemp-0 are high or low.

It should be noted that the exclusive NOR gate 631 can be considered to set the thinning rate used to thin out the number of pulses of the indirect refresh trigger RFTG-1 so as to generate the direct refresh trigger RFTG-2. The thinning rate here is either 0% (no thinning out) or 50% because the refresh rate is defined to be one of the two levels, i.e., one fold or 0.5 fold as illustrated in FIG. 6. In this case, the thinning rate is 0% (no thinning out) when the output of the exclusive NOR gate 631 is high, and 50% when the output thereof is low.

The selector 632 selects either the output of the exclusive NOR gate 631 or the fixed signal fixed at high level in response to the mode switching signal TRNMODE and outputs the selected signal. We assume here that the mode switching signal TRNMODE is high because the common control mode is selected. Therefore, the selector 632 always selects the output of the exclusive NOR gate 631 and outputs this signal.

The flip-flop 633 outputs a signal S1 as a signal S2 that is synchronous with the indirect refresh trigger RFTG-1. The signal S1 is the output of the selector 632.

The flip-flop 634 and inverter 635 generate a signal S3 that is inverted each time the indirect refresh trigger RFTG-1 is obtained. Therefore, the flip-flop 634 receives the indirect refresh trigger RFTG-1 as its clock. On the other hand, the inverter 635 inverts the signal S3, i.e., the output of the flip-flop 634, and feeds it back to the input of the flip-flop 634.

The AND gate 636 outputs a signal S4, i.e., the logical product of the signal S3 and the indirect refresh trigger RFTG-1. The signal S4 is obtained by thinning out pulses from the indirect refresh trigger RFTG-1. In this case, the AND gate 636 thins out every other pulse. This means that the pulses are thinned out with a 50% thinning rate.

The selector 637 selects either the indirect refresh trigger RFTG-1 or signal S4 in response to the signal S2 and outputs the selected signal. The signal S2, i.e., the selector switching signal, is associated with the output of the exclusive NOR gate 631 equivalent to the thinning rate setting. The selector 637 operates in a manner which is equivalent to thinning out the pulses from the indirect refresh trigger RFTG-1 according to the set thinning rate and outputting the signal with a thinned-out number of pulses.

The flip-flop 638 outputs the output of the selector 637 as the direct refresh trigger RFTG-2 in synchronism with an external clock CLK. It should be noted that the flip-flop 638 may be omitted, for example, if an asynchronous memory array is used as the memory array 250. Substantially, therefore, the output of the selector 637 serves as the direct refresh trigger RFTG-2.

Figure 4B:
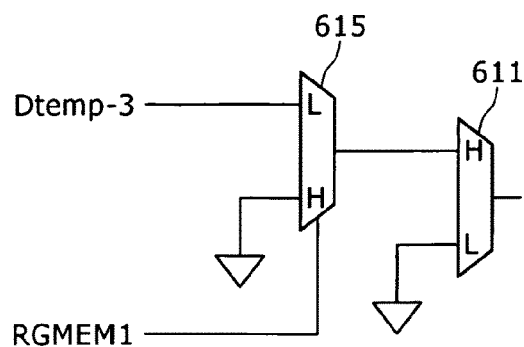

FIG. 4B illustrates another example of the fixed signal circuit of the temperature information selection section 610. That is, a selector 615 is provided in place of the NAND gate 612 and inverter 613. The selector 615 is supplied with the input selection temperature information Dtemp-3 and a fixed signal fixed at low level as its inputs. The selector 615 is supplied with register information RGMEM1 as a switching signal. When high, the register information RGMEM1 indicates that the associated memory is the one at the first stage. When low, the register information RGMEM1 indicates that the associated memory is the one at a stage other than the first stage. As a result, if the associated memory is any one of the second to nth memories 200-2 to 200-n at the second stage or beyond, the input selection temperature information Dtemp-3 is output to the selector 611. If the associated memory is the first memory 200-1 at the first stage, the low-level fixed signal at low level is output to the selector 611.

[Operation of the Trigger Issuance Frequency Setting Section]

Figure 5:
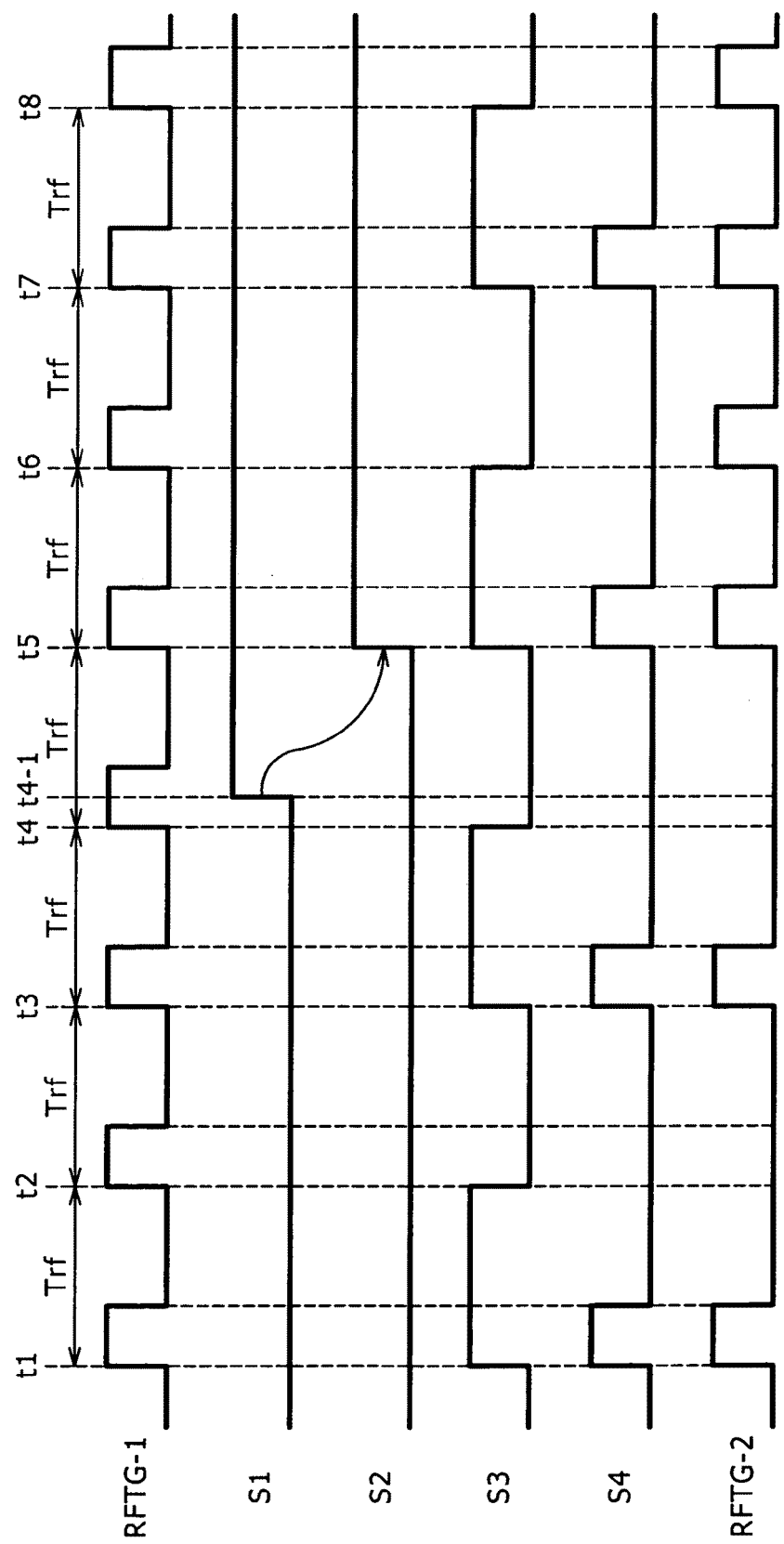
FIG. 5 is a timing diagram illustrating the operation of a trigger issuance frequency setting section.

The timing diagram shown in FIG. 5 illustrates the operation of the trigger issuance frequency setting section 630. It should be noted that the operation shown in FIG. 5 also assumes that the mode switching signal TRNMODE is high because the common control mode is selected.

First, the indirect refresh trigger RFTG-1 is output at regular intervals, namely, every trigger period Trf. It should be noted, however, that the trigger period Trf changes according to whether the integrated temperature information Dtemp-2 supplied to the logic block 300 (memory controller 310) is high or low. That is, the memory controller 310 issues a refresh command, for example, at intervals of a time length T when the integrated temperature information Dtemp-2 is high temperature according to the definitions shown in FIG. 6. In contrast, the memory controller 310 issues a refresh command at intervals of a time length 2T which is twice as long as the time length T when the integrated temperature information Dtemp-2 is low temperature. The pulse period of the indirect refresh trigger RFTG-1 is associated with the timings at which the refresh command is issued. Therefore, the trigger period Trf is switched, for example, between the time lengths T and 2T.

In this case, the signal S1 is the output of the exclusive NOR gate 631 obtained via the selector 632. Here, the integrated temperature information Dtemp-2 does not match the own temperature information Dtemp-0 prior to time t4-1. At time t4-1, however, either of the integrated temperature information Dtemp-2 and own temperature information Dtemp-0 is inverted. As a result, there is a match between the two pieces of information because both thereof are either high or low. Therefore, the signal S1 is low prior to time t4-1 and high at time t4-1 and beyond.

The signal S1 is inverted while the indirect refresh trigger RFTG-1 that has changed to high level since time t4 is still high. This means that the signal S1 and indirect refresh trigger RFTG-1 are not synchronous with each other. The flip-flop 634 shifts the timing of the signal S1 so that the leading edge of the signal S1 is synchronous with that of the indirect refresh trigger RFTG-1. The flip-flop 634 outputs the resultant signal as the signal S2. The signal S2 output as described above changes from low to high level at time t5 when the indirect refresh trigger RFTG-1 rises for the first time after time t4-1 as illustrated in FIG. 5.

Next, the signal S3 output from the flip-flop 634 changes from low to high or high to low level, for example, each time the pulse of the indirect refresh trigger RFTG-1 rises, as illustrated in FIG. 5. The signal S4 output from the AND gate 636 is the logical product of the signal S3 and the indirect refresh trigger RFTG-1. As illustrated in FIG. 5, therefore, the signal S4 appears for every two pulses of the indirect refresh trigger RFTG-1. That is, the signal S4 is obtained by thinning out the pulses from the indirect refresh trigger RFTG-1 with a thinning ratio of 1/2.

The selector 637 selects and outputs the signal S4 as the direct refresh trigger RFTG-2 prior to time t5 when the signal S2, that is supplied to the selector 637 as a switching signal, is low. In contrast, the selector 637 selects and outputs the indirect refresh trigger RFTG-1 at time t5 and beyond.

Thus, the trigger issuance frequency setting section 630 shown in FIG. 4 changes and sets the issuance frequency of the direct refresh trigger RFTG-2 at a 1:2 ratio according to whether the temperature conditions indicated by the own temperature information Dtemp-0 and integrated temperature information Dtemp-2 are the same.

Incidentally, in the trigger issuance frequency setting section 630 shown in FIG. 4A, the flip-flop 633 may be omitted so that the signal S1 is supplied to the selector 637 as a switching signal as it is. In this case, however, we assume that the signal S2 changes to low level while the indirect refresh trigger RFTG-1 is high as in the case of time t4-1 in FIG. 5. As a result, the selector 637 changes its selection from the indirect refresh trigger RFTG-1 which is high to the signal S4 which is low at time t4-1. This leads, for example, to disturbance or loss of the pulse waveform of the direct refresh trigger RFTG-2 due to shorter output time, which is not preferred, for example, in terms of operational stability. In the present embodiment, therefore, the signal S2 output from the flip-flop 633 is synchronous with the indirect refresh trigger RFTG-1. As a result, the signal switching performed by the selector 637 is also synchronous with the indirect refresh trigger RFTG-1, thus eliminating the likelihood of disturbance or loss of the pulse waveform of the direct refresh trigger RFTG-2.

[Truth Tables]

FIGS. 7A and 7B are truth tables for the operation of the refresh control circuit 600 shown in FIG. 4. It should be noted that not only the operation in the common control mode, as has been assumed up to now, but also that in the individual control mode are included in the truth tables.

FIG. 7A is a truth table for the operation of the temperature information selection section 610. First, the mode switching signal TRNMODE is "H" in the common control mode. In this condition, the output selection temperature information Dtemp-1 is "L" (temperature condition: low) when the own temperature information Dtemp-0 is "L" (temperature condition: low) and the input selection temperature information Dtemp-3 is "L" (temperature condition: low). Further, the output selection temperature information Dtemp-1 is "H" (temperature condition: high) when the own temperature information Dtemp-0 is "H" (temperature condition: high) and the input selection temperature information Dtemp-3 is "L" (temperature condition: low). Still further, the output selection temperature information Dtemp-1 is "H" (temperature condition: high) when the own temperature information Dtemp-0 is "L" (temperature condition: low) and the input selection temperature information Dtemp-3 is "H" (temperature condition: high). The output selection temperature information Dtemp-1 is "H" (temperature condition: high) when the own temperature information Dtemp-0 is "H" (temperature condition: high) and the input selection temperature information Dtemp-3 is "H" (temperature condition: high). This truth table is for the operation adapted to select the temperature information containing the temperature condition indicating the higher temperature of the two pieces of information, i.e., the own temperature information Dtemp-0 and input selection temperature information Dtemp-3, as the output selection temperature information Dtemp-1. This truth table is also for the operation adapted to output the output selection temperature information Dtemp-1 indicating the same temperature condition if the temperature conditions of the own temperature information Dtemp-0 and input selection temperature information Dtemp-3 are the same.

A description will be also given of the individual control mode. In the individual control mode, the mode switching signal TRNMODE is "L." In this condition, when the own temperature information Dtemp-0 is "L" (temperature condition: low), the input selection temperature information Dtemp-3 is ignored, and the output selection temperature information Dtemp-1 is also "L" (temperature condition: low). On the other hand, when the own temperature information Dtemp-0 is "H" (temperature condition: high), the input selection temperature information Dtemp-3 is ignored, and the output selection temperature information Dtemp-1 is also "H" (temperature condition: high). That is, the own temperature information Dtemp-0 is output as it is as the output selection temperature information Dtemp-1 regardless of the temperature condition of the input selection temperature information Dtemp-3. It should be noted that ignoring the input selection temperature information Dtemp-3 corresponds to the operation adapted to maintain the input selection temperature information Dtemp-3 at "L" at all times using the fixed signal circuit (NAND gate 612 and inverter 613) from the activation and beyond, for example, in FIG. 4A. Thus, in the individual control mode, the output selection temperature information Dtemp-1 output from each of the memories 200 is supplied to the logic block 300 via a different signal path.

FIG. 7B is a truth table for the operation of the trigger issuance frequency setting section 630. First, in the common control mode, the mode switching signal TRNMODE is "H." In this condition, when the own temperature information Dtemp-0 is "L" (temperature condition: low), and the integrated temperature information Dtemp-2 is "L" (temperature condition: low), the direct refresh trigger RFTG-2 is issued for each refresh command received. In this case, a refresh command is issued with a 0.5-fold refresh rate in accordance with the low temperature. In addition, the memory 200 itself is at low temperature. Therefore, the direct refresh trigger RFTG-2 is issued as frequently as a refresh command is received. This corresponds to the fact that if, for example, the unit number of times a refresh command is received is defined to be once, the number of issuances of the direct refresh trigger RFTG-2 for the unit number of times, i.e., once, is once.

Further, when the own temperature information Dtemp-0 is "L" (temperature condition: low), and the integrated temperature information Dtemp-2 is "H" (temperature condition: high), the direct refresh trigger RFTG-2 is issued for each two refresh commands received. At this time, a refresh command is issued with a one-fold refresh rate in accordance with the high temperature. In contrast, the memory 200 itself is at low temperature. Therefore, a 0.5-fold refresh rate is enough. For this reason, the direct refresh trigger RFTG-2 is issued half as frequently as a refresh command is received. This corresponds to the fact that the number of issuances of the direct refresh trigger RFTG-2 is set to 0.5 times in accordance with the unit number of times a refresh command is received, i.e., once.

Still further, when the own temperature information Dtemp-0 is "H" (temperature condition: high), and the integrated temperature information Dtemp-2 is "H" (temperature condition: high), the direct refresh trigger RFTG-2 is issued for each refresh command received. At this time, a refresh command is issued with a one-fold refresh rate in accordance with the high temperature. However, the memory 200 itself is at high temperature. Therefore, the same one-fold refresh rate is selected. As a result, the direct refresh trigger RFTG-2 is issued as frequently as a refresh command is received.

In the individual control mode, on the other hand, the mode switching signal TRNMODE is "L." In this condition, when the own temperature information Dtemp-0 is "L" (temperature condition: low), the integrated temperature information Dtemp-2 is ignored, and the direct refresh trigger RFTG-2 is issued for each refresh command received. In contrast, when the own temperature information Dtemp-0 is "H" (temperature condition: high), the integrated temperature information Dtemp-2 is ignored, and the direct refresh trigger RFTG-2 is issued for each refresh command received. That is, the direct refresh trigger RFTG-2 is always issued for each refresh command received.

The above operation is obtained as a result of the selector 632 outputting a high-level fixed signal at all times in response to the low-level mode switching signal TRNMODE supplied to the selector 632 as a selection control signal. This allows for the indirect refresh trigger RFTG-1 to be selected, regardless of the temperature condition of the own temperature information Dtemp-0, and output by the selector 637 as the direct refresh trigger RFTG-2.

[Example of Expansion of the Temperature Conditions Contained in Temperature Information]

In the description given up to this point, the temperature information Dtemp represents the temperature condition with a binary value of high or low temperature. However, the present embodiment may be upgraded so that the temperature condition is represented with three or more resolution levels. That is, the number of temperature conditions represented by the temperature information Dtemp can be a k-level value (where k is an integer equal to or greater than 3). It should be noted that upgrading to a k-level value extends to all of the own temperature information Dtemp-0, output selection temperature information Dtemp-1, input selection temperature information Dtemp-3 and integrated temperature information Dtemp-2. On the other hand, we assume that the greater the number assigned to the temperature condition, the higher the temperature.

FIG. 8 is a truth table illustrating an example of operation of the temperature information selection section 610 when the temperature condition is represented by a k-level value where k is equal to or greater than 3. It should be noted that not only the operation in the common control mode, as has been assumed up to now, but also that in the individual control mode are included in the truth table in FIG. 8, as well.

A description will be given first of the common control mode in which the mode switching signal TRNMODE is "H" with reference to FIG. 8. If the temperature condition is a k-level value in the present embodiment, the input selection temperature information Dtemp-3 can assume any one of temperature conditions #1 to #k for each of the temperature conditions #1 to #k of the own temperature information Dtemp-0.

First, when the own temperature information Dtemp-0 indicates the temperature condition #1, and when the input selection temperature information Dtemp-3 similarly indicates the temperature condition #1, then the output selection temperature information Dtemp-1 also indicates the temperature condition #1. Next, when the input selection temperature information Dtemp-3 indicates any one of the temperature conditions #2 to #k, the input selection temperature information Dtemp-3 is higher in any of these cases. As a result, the output selection temperature information Dtemp-1 indicates the same temperature condition (one of #2 to #k) as that of the input selection temperature information Dtemp-3.

On the other hand, when the own temperature information Dtemp-0 indicates the temperature condition #2, and when the input selection temperature information Dtemp-3 indicates the temperature condition #1, then the own temperature information Dtemp-0 which is higher is selected. Therefore, the output selection temperature information Dtemp-1 indicates the temperature condition #2. Further, when the input selection temperature information Dtemp-3 indicates the temperature condition #2, i.e., the same condition as that of the own temperature information Dtemp-0, the output selection temperature information Dtemp-1 also indicates the temperature condition #2. Next, when the input selection temperature information Dtemp-3 indicates the temperature condition #3 which is higher than that of the own temperature information Dtemp-0, the temperature condition of the input selection temperature information Dtemp-3 is selected. Therefore, the output selection temperature information Dtemp-1 indicates the temperature condition #3. For the combinations that follow, the temperature condition of the input selection temperature information Dtemp-3 is selected when the input selection temperature information Dtemp-3 indicates any one of the temperature conditions #4 to #k. Therefore, the output selection temperature information Dtemp-1 indicates the same temperature condition (one of #4 to #k) as that of the input selection temperature information Dtemp-3.

On the other hand, when the own temperature information Dtemp-0 indicates the temperature condition #3, and when the input selection temperature information Dtemp-3 indicates any one of the temperature conditions #1 to #3, then the own temperature information Dtemp-0 is higher than or equal to the input selection temperature information Dtemp-3 in temperature. Therefore, the output selection temperature information Dtemp-1 indicates the temperature condition #3. Next, when the input selection temperature information Dtemp-3 indicates the temperature condition #4 which is higher than the temperature condition of the own temperature information Dtemp-0, the temperature condition of the input selection temperature information Dtemp-3 is selected. As a result, the output selection temperature information Dtemp-1 indicates the temperature condition #4. Further, the temperature condition of the input selection temperature information Dtemp-3 is selected when the input selection temperature information Dtemp-3 indicates any one of the temperature conditions #5 to #k. Therefore, the output selection temperature information Dtemp-1 indicates the same temperature condition (one of #5 to #k) as that of the input selection temperature information Dtemp-3.

For the combinations that follow, the higher temperature of the two pieces of information, i.e., the own temperature information Dtemp-0 and input selection temperature information Dtemp-3, is similarly selected as the output selection temperature information Dtemp-1 when the own temperature information Dtemp-0 indicates the temperature condition #4 or other higher temperature condition. On the other hand, when the same temperature condition is indicated by the own temperature information Dtemp-0 and input selection temperature information Dtemp-3, this temperature condition is selected as the output selection temperature information Dtemp-1. Then, when the own temperature information Dtemp-0 indicates the temperature condition #k, i.e., the highest temperature, as illustrated in FIG. 8, the output selection temperature information Dtemp-1 always indicates the temperature condition #k.

In the individual control mode, on the other hand, the mode switching signal TRNMODE is "L." In this condition, the temperature information selection section 610 operates in the following manner. That is, the same temperature condition as that of the own temperature information Dtemp-0 is selected as the output selection temperature information Dtemp-1 regardless of the temperature condition of the input selection temperature information Dtemp-3.

FIG. 9 is a truth table for the trigger issuance frequency setting section 630 when the temperature condition Dtemp is a k-level value. It should be noted that not only the operation in the common control mode, as has been assumed up to now, but also that in the individual control mode are included in the truth table in FIG. 9, as well.

Several refresh rate settings are possible when the temperature condition is represented by a k-level value. Here, the refresh rate setting is defined as follows. That is, letting the variable representing the temperature condition be denoted by m, the refresh rate is set by a multiple given by the equation $\frac{1}{2}^{(k-m)}$. More specifically, assuming that the refresh rate is one fold for the highest temperature condition #k, the temperature declines in descending order of the number assigned to the temperature condition, i.e., temperature conditions #k-1, #k-2, #k-3 and so on. In response, the refresh rate changes to $\frac{1}{2}$ fold, to $\frac{1}{4}$ fold, to $\frac{1}{8}$ fold and so on. In the description of FIG. 9, on the other hand, the variable for each of the numbers assigned to the temperature conditions of the own temperature information Dtemp-0 is denoted by "p," and the variable for each of the numbers assigned to the temperature conditions of the integrated temperature information Dtemp-2 is denoted by "q." In the column for the refresh trigger RFGT-2 in FIG. 9, the temperature condition numbers of the own temperature information Dtemp-0 and integrated temperature information Dtemp-2 are substituted into the variables "p" and "q."

In FIG. 9, first of all, the mode switching signal TRNMODE is also "H" in the common control mode. In this condition, when the own temperature information Dtemp-0 indicates the temperature condition #1 which is the lowest temperature, a pulse of the direct refresh trigger RFTG-2 is "issued for each two$^{(q-p)}$ refresh commands received." This corresponds to the fact that if the unit number of times a refresh command is received is defined to be once, the number of issuances of the direct refresh trigger RFTG-2 is set to $\frac{1}{2}^{(q-p)}$. More specifically, therefore, as the temperature condition indicated by the integrated temperature information Dtemp-2 changes from the temperature condition #1 to the temperature conditions #2, #3 and so on, the number of issuances of a pulse of the direct refresh trigger RFTG-2 diminishes from $\frac{1}{2}$ (once for each two refresh commands) to $\frac{1}{4}$ (once for each four refresh commands), to $\frac{1}{8}$ (once for each eight refresh commands) and so on.

Further, when the own temperature information Dtemp-0 indicates the temperature condition #2, and when the integrated temperature information Dtemp-2 indicates the temperature condition #1, a combination arises in which the integrated temperature information Dtemp-2 is lower in temperature than the own temperature information Dtemp-0. In this case, a pulse of the direct refresh trigger RFTG-2 is "issued two$^{(p-q)}$ times for each refresh command received." This corresponds to the fact that the number of issuances of the direct refresh trigger RFTG-2 is set to $2^{(p-q)}$ for the unit number of times a refresh command is received which is defined to be once. More specifically, in this case, a pulse of the direct refresh trigger RFTG-2 is output two$^{(2-1)}$ times, i.e., twice, as frequently as a refresh command is received. On the other hand, when the integrated temperature information Dtemp-2 indicates the temperature condition #2 or other higher temperature condition which is equal to or higher than the own temperature information Dtemp-0 in temperature, the direct refresh trigger RFTG-2 is "issued once for each two$^{(q-p)}$ refresh commands received."

For the combinations that follow, the same rule as above holds for each of the cases in which the own temperature information Dtemp-0 indicates the temperature condition #3 or other higher temperature condition. That is, in the combinations in which the temperature condition of the integrated temperature information Dtemp-2 is lower in temperature than that of the own temperature information Dtemp-0, a pulse of the direct refresh trigger RFTG-2 is "issued two$^{(p-q)}$ times for each refresh command received." On the other hand, when the temperature condition of the integrated temperature information Dtemp-2 is equal to or higher than that of the own temperature information Dtemp-0 in temperature, the direct refresh trigger RFTG-2 is "issued once for each two$^{(q-p)}$ refresh commands received." Then, when the own temperature information Dtemp-0 indicates the temperature condition #k, i.e., the highest temperature, the direct refresh trigger RFTG-2 is "issued two$^{(p-q)}$ times for each refresh command received" in each of the cases in which the integrated temperature information Dtemp-2 indicates one of the temperature conditions #1 to #k.

It should be noted that in order to issue the direct refresh trigger RFTG-2 more frequently than a refresh command is received for consistency with the combinations in which the integrated temperature information Dtemp-2 is lower in temperature than the own temperature information Dtemp-0, a possible solution would be to provide a multiplier. This multiplier can be configured, for example, with an oscillator. That is, this oscillator need only generate two$^{(p-q)}$ times as many pulses for each pulse of the indirect refresh trigger RFTG-1 supplied. This provides the direct refresh trigger RFTG-2 that is synchronous with the indirect refresh trigger RFTG-1 and two$^{(p-q)}$ times higher in frequency than the indirect refresh trigger RFTG-1.

As described earlier, we assume here that the refresh rate is set by a multiple given by the equation $\frac{1}{2}^{(k-m)}$ using the variables representing the temperature conditions. The operation of the truth table shown in FIG. 9 generates a pulse of the direct refresh trigger RFTG-2 according to this refresh rate and at the frequency suitable for the own temperature information Dtemp-0 at all times.

In the individual control mode, on the other hand, the mode switching signal TRNMODE is "L." In this condition, the temperature information selection section 610 operates in the following manner. That is, the integrated temperature information Dtemp-2 is ignored, and the direct refresh trigger RFTG-2 is "issued for each refresh command received" for each of the temperature conditions #1 to #k indicated by the output selection temperature information Dtemp-1.

It should be noted that the configuration of the refresh control circuit 600 using logic circuits is not limited to that shown in FIG. 4. Instead, the refresh control circuit 600 may adopt any circuit configuration so long as the truth table shown, for example, in FIG. 7, 8 or 9 is satisfied.

2. Second Embodiment

Example of Outline of a Stacked Memory System

In the memory system 100 according to the present embodiment that has been described up to this point, there are no particular restrictions, for example, as to the physical layout of the memories 200 and logic block 300. For example, the layout of the chips of the memories 200 and logic block 300 at different positions in the plane direction is also included in the first embodiment of the present invention. In contrast, the second embodiment of the present invention is intended for a so-called stacked memory system in which the chips of the memories 200 and logic block 300 are stacked one on top of the others. Stacking permits, for example, significant physical size reduction of the module of the memory system 200.

Figure 10:
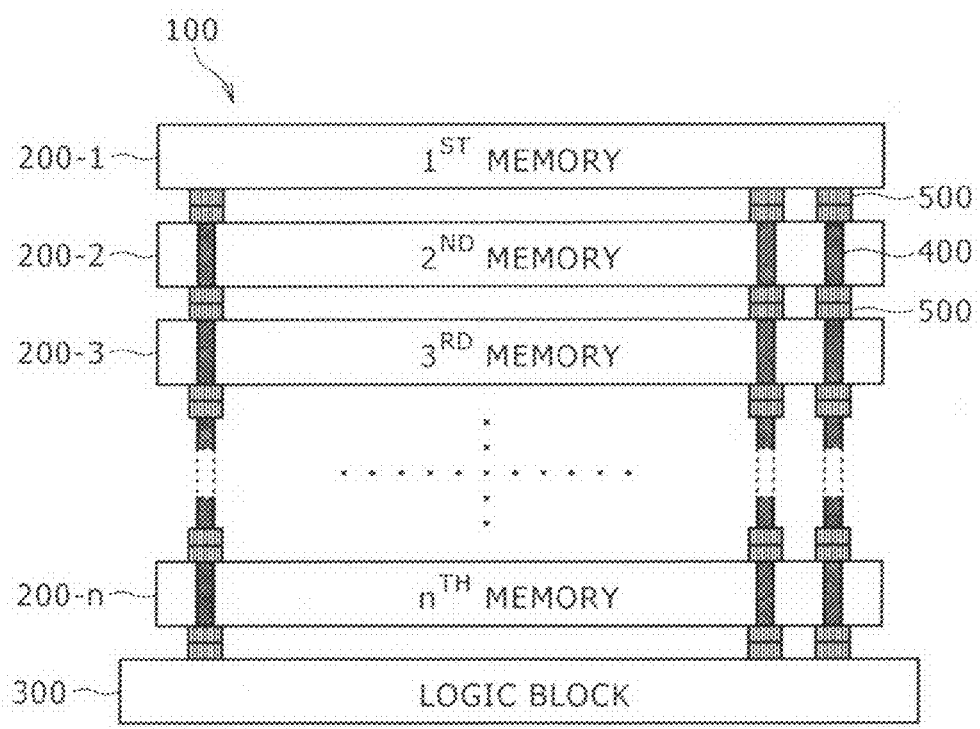
FIG. 10 is a diagram illustrating an overall configuration example of the memory system as a stacked memory system according to a second embodiment of the present invention.

FIG. 10 illustrates an example of physical layout of the memories 200 and logic block 300 as seen from the side as the stacked memory system 100 according to the second embodiment of the present invention. In the memory system 100 shown in FIG. 10, the first to nth memories 200-1 to 200-n are arranged sequentially from the top stage (first stage) down first. In this condition, the logic block 300 is arranged below the nth memory 200-n.

Further, the memory system 100 according to the second embodiment of the present invention adopts TSVs (Through Silicon Vias) for electrical connection between the chips of the memories 200 and logic block 300. A TSV is an electrode that vertically penetrates a silicon semiconductor chip and is used to replace the traditional wire bonding interconnection.

FIG. 10 illustrates a case in which TSVs 400 are formed in each of the second memory 200-2 at the second stage to the nth memory 200-n at the lowest (final) stage. In this case, on the other hand, a microbump 500 is provided where one of the formed TSVs 400 emerges on the front and rear surfaces of each of the chips of the memories 200-2 to 200-n in which the TSVs 400 are formed. The connection with the adjacent upper and lower chips is achieved by connecting the microbumps 500 together.

In this condition, FIG. 10 illustrates the TSVs 400 provided at the same positions in the chip plane direction in each of the stacked second to nth memories 200-2 to 200-n. This makes it possible to form a common signal path shared among the first to nth memories 200-1 to 200-n and logic block 300.

We assume here that the stacked memory system is combined with the existing temperature information wiring that has been described earlier. In this case, the own temperature information of each memory has to be individually connected to the logic block. Therefore, each connection has to be made using a different wire. In addition, these wires cannot share the TSVs. As a result, a memory located somewhere in the middle of the stack has to have TSVs to allow the wires of the own temperature information, drawn out from each of the upper memories, to pass through this memory. For example, the lower the stage of the memory, the larger the number of TSVs for the own temperature information. That is, in this case, it is necessary to manufacture memory chips each of which has a different number of TSVs formed for the different stages of the stack. This leads, for example, to increased cost, which is not preferred.

In order to avoid this problem with the existing technique, the temperature information of only the lowermost memory, i.e., the memory closest to the logic block, is supplied to the logic block. In this case, the logic block controls the refresh by issuing a common refresh command to all the memories based only on the temperature information of the lowermost memory, which is the simplest of all refresh control schemes. In a stacked memory, the upper memories tend to be low in temperature because of their proximity to heat sinks, whereas the lower memories are prone to high temperatures because of trapped heat resulting from their distance to heat sinks. That is, there is a large difference in temperature between the upper and lower memories. This makes it extremely difficult, for example, to refresh all the memories at proper frequencies. In contrast, the wires for temperature information are routed as described below in the second embodiment of the present invention.

[Wiring between the Chips]

Figure 11:
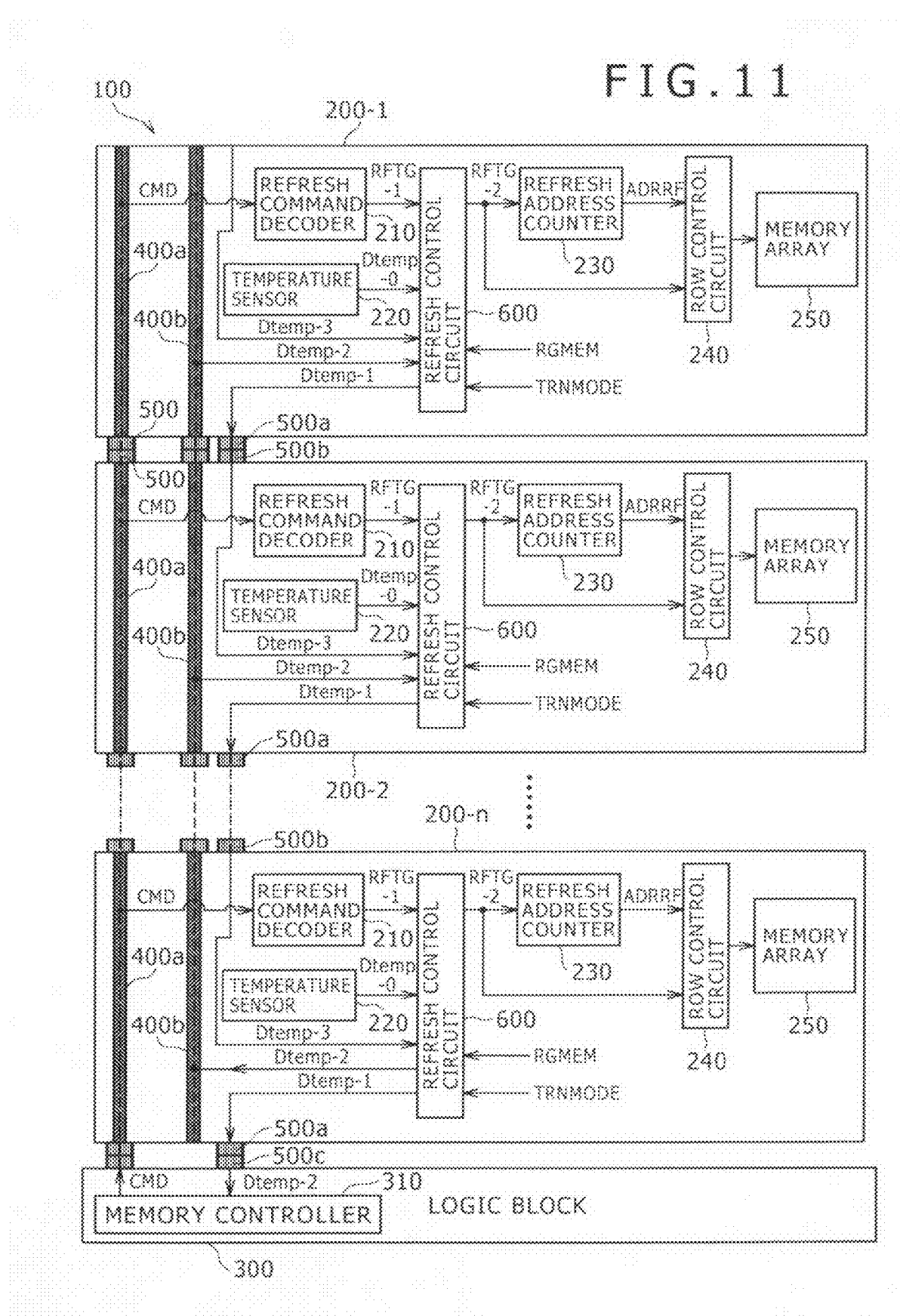
FIG. 11 is a diagram illustrating an example of physical wiring structure of the memory system according to the second embodiment of the present invention.

FIG. 11 illustrates an example of physical wiring between the chips of the memory system 100 according to the second embodiment of the present invention. It should be noted that the first memory 200-1 shown in FIG. 11 is roughly identical in functional circuit block configuration to the memory shown in FIG. 2. We assume that the remaining second to nth memories 200-2 to 200-n have the same configuration. That is, we assume that the first to nth memories 200-1 to 200-n have been manufactured to the same specification. Further, the logic block 300 is identical in internal configuration to that shown in FIG. 1.

In the second embodiment of the present invention, on the other hand, the commands CMD and the temperature information Dtemp-1 to Dtemp-3 are exchanged between the memory chips and logic block chip in the same manner as described with reference to FIG. 1.

In the present embodiment, each of the first to nth memories 200-1 to 200-n includes a CMD TSV 400a and an integrated temperature TSV 400b as illustrated in FIG. 11.

As illustrated in FIG. 1, the signal path of the commands CMD is shared between the first to nth memories 200-1 to 200-n and logic block 300. Therefore, the CMD TSV 400a is formed at the same position on each of the chips of the first to nth memories 200-1 to 200-n. Next, the CMD TSVs 400a are connected together through junction between the microbumps 500 of the chips vertically adjacent to each other as illustrated in FIG. 11. Further, the CMD TSV 400a is connected to the command input terminal of the refresh command decoder 210 in each of the first to nth memories 200-1 to 200-n. Still further, the command output terminal of the memory controller 310 is connected to the microbump 500 provided at the same position as the CMD TSV 400a in the logic block 300. This makes it possible to output the command CMDs from the memory controller 310 in common to the refresh command decoders 210 of the first to nth memories 200-1 to 200-n via the common signal path.

On the other hand, the signal path of the integrated temperature information Dtemp-2 is shared between the first to nth memories 200-1 to 200-n also as illustrated in FIG. 1. Therefore, the integrated temperature TSV 400b is formed at the same position on each of the chips of the first to nth memories 200-1 to 200-n and separately from the CMD TSV 400a. The integrated temperature TSVs 400b are connected together through junction between the microbumps 500 of the chips vertically adjacent to each other. Further, the integrated temperature TSV 400b is connected to the integrated temperature information input terminal of the refresh control circuit 600 in each of the first to nth memories 200-1 to 200-n. This makes it possible to supply the integrated temperature information Dtemp-2 from the nth memory 200-n in common to the remaining upper memories 200-1 to 200-n-1 via the common signal path.

As illustrated in FIG. 1, on the other hand, the output selection temperature information Dtemp-1 output from all the memories other than that at the final stage has to be supplied to the memory 200 at the next stage as the input selection temperature information Dtemp-3. Further, the integrated temperature information Dtemp-2 has to be output from the nth memory 200-n at the final stage as the output selection temperature information Dtemp-1.

In response to the above, an output selection temperature information microbump 500a adapted to output the output selection temperature information Dtemp-1 is provided at the same position on the bottom surface of the chip of each of the memories 200. Further, an input selection temperature information microbump 500b adapted to receive the input selection temperature information Dtemp-3 is provided at the same position in the plane direction on the top surface of the chip of each of the memories 200 as the output selection temperature information microbump 500a. It should be noted, however, that there is no need to provide the input selection temperature information microbump 500b on the uppermost first memory 200-1. This ensures that the input terminal of the input selection temperature information Dtemp-3 is open to the refresh control circuit 600 in the first memory 200-1. Further, an integrated temperature information microbump 500c adapted to receive the integrated temperature information Dtemp-2 is provided at the same position in the plane direction on the top surface of the chip of the logic block 300 as the output selection temperature information microbump 500a on each of the memories 200.

Then, the output selection temperature information microbump 500a and input selection temperature information microbump 500b are joined between the chips vertically adjacent to each other. On the other hand, the output selection temperature information microbump 500a and integrated temperature information microbump 500c are joined between the chips of the nth memory 200-n at the final stage and the logic block 300. This allows for a signal path of the integrated temperature information Dtemp-2 to be formed in the memory system 100.

It should be noted that the output selection temperature information microbump 500a, input selection temperature information microbump 500b, integrated temperature TSV 400b and microbump 500 provided in combination with the same TSV 400b are examples of the electrode described in the appended claims.

Thus, the second embodiment of the present invention allows for the same physical wiring structure for temperature information to be used for all the memories 200. More specifically, it is only necessary to provide the integrated temperature TSV 400, output selection temperature information microbump 500a and input selection temperature information microbump 500b at the same positions on all the memories 200. This makes it possible to use the memories manufactured by the same process as the memories 200 to be stacked to form the memory system 100. Further, this provides a simpler wiring used to exchange temperature information between the memories 200 and logic block 300.

It should be noted that the preferred embodiments of the present invention are merely examples for implementing the present invention. As described explicitly in the preferred embodiments of the present invention, there is a correspondence between the features of the preferred embodiments of the present invention and the characteristic features of the invention disclosed in the appended claims. Similarly, there is a correspondence between the characteristic features of the invention disclosed in the appended claims and the identically named features in the preferred embodiments of the present invention. It is to be understood that the present invention is not limited to the preferred embodiments but may be modified in various ways without departing from the scope of the present invention.

The present application contains subject matter related to that disclosed in Japanese Priority Patent Application JP 2010-036311 filed in the Japan Patent Office on Feb. 22, 2010, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A storage device comprising:
N storage units $U_i$ arranged in stages, where $N \geq 2$ and i is an index from 1 to N that designates the stages of the respective storage units; and
a control unit configured to output a refresh command, wherein each of the storage units $U_i$ includes:
    a temperature sensor adapted to detect a temperature condition and to generate own-temperature-information $T0_i$,
    a temperature information selection section configured to output outputted-temperature-information $T1_i$,
    a refresh command reception section configured to receive the refresh command, and
    a trigger issuance frequency setting section configured to generate a refresh trigger in response to the reception of the refresh command, where the refresh trigger causes a memory array to perform a refresh and a frequency $F_i$ of the refresh trigger is based on: the refresh command, the outputted-temperature-information $T1_N$ of the storage unit $U_N$ at the final stage, and the own temperature information $T0_i$,
wherein the respective temperature information selection sections of the storage units $U_{i \neq 1}$ that are in a stage after the first stage are each configured to:
    receive outputted-temperature-information $T1_{i-1}$ from a previous stage storage unit $U_{i-1}$, and
    select either the outputted-temperature-information $T1_{i-1}$ from the previous stage storage unit $U_{i-1}$ or the own-temperature-information $T0_i$ of the storage unit $U_i$ to be outputted as the outputted-temperature-information $T1_i$ of the storage unit $U_i$ and
wherein the control unit is configured to set a transmission frequency at which the refresh command is output according to the outputted-temperature-information $T1_N$ of the storage unit $U_N$ at the final stage.

2. The storage device of claim 1,
wherein the respective trigger issuance frequency setting sections of the storage units $U_i$ are configured to set the respective frequencies $F_i$ of the respective refresh triggers such that respective numbers $A_i$ of issuances of the respective refresh triggers are made for a unit number of receptions of the refresh command.

3. The storage device of claim 2,
wherein the respective trigger issuance frequency setting sections of the storage units $U_i$ generate the respective refresh triggers by converting respective temporary refresh triggers, which are issued at a frequency corresponding to the refresh command, into the respective refresh triggers issued at the frequencies $F_i$.

4. The storage device of claim 1,
wherein each of the storage units $U_i$ further includes a signal switching section configured to form signal paths such that:
    when the signal switching section is in the storage unit $U_N$ at the final stage:
        the outputted-temperature-information $T1_N$ is output to the respective trigger issuance frequency setting sections of the storage units $U_{i \neq N}$ that are in a stage other than the final stage, and
        the outputted-temperature-information $T1_N$ is supplied from the temperature information selection section of the storage unit $U_N$ to the trigger issuance frequency setting section of the storage unit $U_N$,
    when the signal switching section is in a storage unit $U_{i \neq N}$ in a stage other than the final stage:
        the outputted-temperature-information $T1_i$ is output to the temperature information selection section of a subsequent stage storage unit $U_{i+1}$, and
        the outputted-temperature-information $T1_N$ of the storage unit $U_N$ is supplied to the trigger issuance frequency setting section of the storage unit $U_i$.

5. The storage device of claim 1,
wherein the temperature information selection section of the storage unit $U_1$ at the first stage selects the own-temperature-information $T0_1$ and outputs this information as the outputted-temperature-information $T1_1$.

6. The storage device of claim 1,
wherein each of the storage units $U_i$ includes a first electrode adapted to output the outputted-temperature-information $T1_i$, which are provided on a first side of the respective storage units $U_i$, and a second electrode adapted to receive the outputted-temperature-information $T1_{i-1}$, which are provided on a second sides of the respective storage units $U_i$ opposite the first side, and
wherein, in each of the storage units $U_i$ the first and second electrodes are located at corresponding positions such that, when any two of the storage units $U_i$ are stacked directly one on top of the other the first electrode of one of the two stacked storage units contacts the second electrode of the other of the two stacked storage units.

7. The storage device of claim 6,
wherein each of the storage units $U_i$ includes a penetrating electrode forming a signal path for the outputted-temperature-information $T1_N$, the penetrating electrode comprising a third electrode adapted to receive the outputted-temperature-information $T1_N$, which are provided on the first side of the respective storage units $U_i$, and a fourth electrode adapted to output the outputted-temperature-information $T1_N$, which are provided on a second sides of the respective storage units $U_i$, and
wherein, in each of the storage units $U_i$ the third and fourth electrodes are located at corresponding positions such that, when any two of the storage units $U_i$ are stacked directly one on top of the other the third electrode of one of the two stacked storage units contacts the fourth electrode of the other of the two stacked storage units.

8. The storage device of claim 7,
wherein the storage units $U_i$ are stacked one on top another in a direction orthogonal to a substrate face with the storage unit $U_1$ of the first stage being located at a top of the stack and the storage unit $U_N$ of the last stage being located at a bottom of the stack, such that:
    the respective first electrodes of the storage units $U_{i \neq N}$ in stages other than the last stage are each connected to the second electrode of the storage unit $U_{i+1}$ in the next stage, the respective third electrodes of the storage units $U_{i \neq N}$ in stages other than the last stage are each connected to the fourth electrode of the storage unit $U_{i+1}$ in the next stage, the first electrode of the storage unit $U_N$ in the last stage is connected to the control unit.

9. The storage device of claim 8, wherein the storage units $U_i$ and the control unit are all in a chip form, wherein the control unit includes a command transmission section adapted to transmit the refresh command to each of the storage units $U_i$ through broadcasting according to the transmission frequency set based on the outputted-temperature-information $T1_N$, and a temperature information input electrode provided on the top surface of the refresh control device to receive the outputted-temperature-information $T1_N$ and located such that the first electrode of the storage unit $U_N$ in the last stage is connected to temperature information input electrode when the storage unit $U_N$ in the last stage is stacked on the control unit.

10. The storage device of claim 9, wherein the refresh command is broadcast to the storage units $U_i$ through a signal path formed by second penetrating electrodes included in each of the storage units $U_i$ at corresponding locations.

\* \* \* \* \*